(12) United States Patent
Hanamoto et al.

(10) Patent No.: US 7,271,423 B2
(45) Date of Patent: Sep. 18, 2007

(54) SEMICONDUCTOR LIGHT-EMITTING DEVICE AND LIGHT-EMITTING DISPLAY DEVICE THEREWITH

(75) Inventors: Tetsuya Hanamoto, Nishinomiya (JP); Wataru Takase, Nara (JP); Kiyoshi Suzuki, Tokyo (JP); Kaori Kanesaka, Tokyo (JP); Tomokazu Sagara, Tokyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/957,472

(22) Filed: Sep. 21, 2001

(65) Prior Publication Data

US 2002/0063301 A1 May 30, 2002

(30) Foreign Application Priority Data

Sep. 21, 2000 (JP) .............................. 2000-287326
Apr. 17, 2001 (JP) .............................. 2001-118790

(51) Int. Cl.
*H01L 33/00* (2006.01)
(52) U.S. Cl. .................. 257/98; 257/90; 257/E33.061; 313/501; 313/503
(58) Field of Classification Search ............ 257/88–90, 257/98; 313/501, 503
See application file for complete search history.

(56) References Cited

U.S. PATENT DOCUMENTS

| 5,813,753 A * | 9/1998 | Vriens et al. ............... 362/293 |
| 5,952,681 A * | 9/1999 | Chen ............................ 257/89 |
| 6,340,824 B1 * | 1/2002 | Komoto et al. ............... 257/99 |
| 6,379,585 B1 * | 4/2002 | Vecht et al. ........... 252/301.65 |

FOREIGN PATENT DOCUMENTS

| JP | 09-153644 | 10/1997 |
| JP | 10-012925 | 1/1998 |
| JP | 10-163535 | 6/1998 |
| JP | 10190053 | 7/1998 |
| JP | 10-242513 | 11/1998 |

OTHER PUBLICATIONS

Shionoya et al., "Phosphor Handbook," 1999, CRC Press, English Revised Edition, 391-392.*

* cited by examiner

*Primary Examiner*—Jerome Jackson
(74) *Attorney, Agent, or Firm*—Morrison & Foerster LLP

(57) ABSTRACT

A semiconductor light-emitting device has a semiconductor light-emitting element for emitting light with emission wavelengths of 390 to 420 nm, wherein the wavelengths of light from the semiconductor light-emitting element are converted by a fluorescent substance having a monochromatic emission peak. The emission wavelengths of 390 to 420 nm, which have almost no adverse effect on human bodies and components of the semiconductor light-emitting device, are in a low human visibility range. Since light whose wavelengths are converted by the fluorescent substance are hardly affected by direct light from the semiconductor light-emitting element, light from the fluorescent substance has a favorable color tone. Also, the semiconductor light-emitting device allows desired luminous colors to be obtained only by changing fluorescent substance materials without changing the structure of the semiconductor light-emitting device or the semiconductor light-emitting element.

21 Claims, 22 Drawing Sheets

EMISSION SPECTRUM OF FLUORESCENT
SUBSTANCE, $0.5MgF_2 \cdot 3.5MgO \cdot GeO_2 : Mn$ EXCITATION SPECTRUM OF FLUORESCENT
SUBSTANCE, $0.5MgF_2 \cdot 3.5MgO \cdot GeO_2 : Mn$ EMISSION SPECTRUM OF FLUORESCENT SUBSTANCE $La_2O_2S:Eu$ EXCITATION SPECTRUM OF FLUORESCENT SUBSTANCE, $La_2O_2S:Eu$ EMISSION SPECTRUM OF FLUORESCENT
SUBSTANCE, $BaMg_2Al_{16}O_{27}$:Eu,Mn EXCITATION SPECTRUM OF FLUORESCENT
SUBSTANCE, $BaMg_2Al_{16}O_{27}$:Eu,Mn EMISSION SPECTRUM OF FLUORESCENT
SUBSTANCE $SrAl_2O_4:Eu$ EXCITATION SPECTRUM OF FLUORESCENT
SUBSTANCE, $SrAl_2O_4:Eu$ EMISSION SPECTRUM OF FLUORESCENT
SUBSTANCE, $(Sr,Ca,Ba,Ce)_{10}(PO_4)_6Cl_2:Eu$ EXCITATION SPECTRUM OF FLUORESCENT
SUBSTANCE, $(Sr,Ca,Ba,Ce)_{10}(PO_4)_6Cl_2:Eu$ EMISSION SPECTRUM OF FLUORESCENT
SUBSTANCE, $BaMgAl_{10}O_{17}:Eu$ EXCITATION SPECTRUM OF FLUORESCENT
SUBSTANCE, $BaMgAl_{10}O_{17}:Eu$

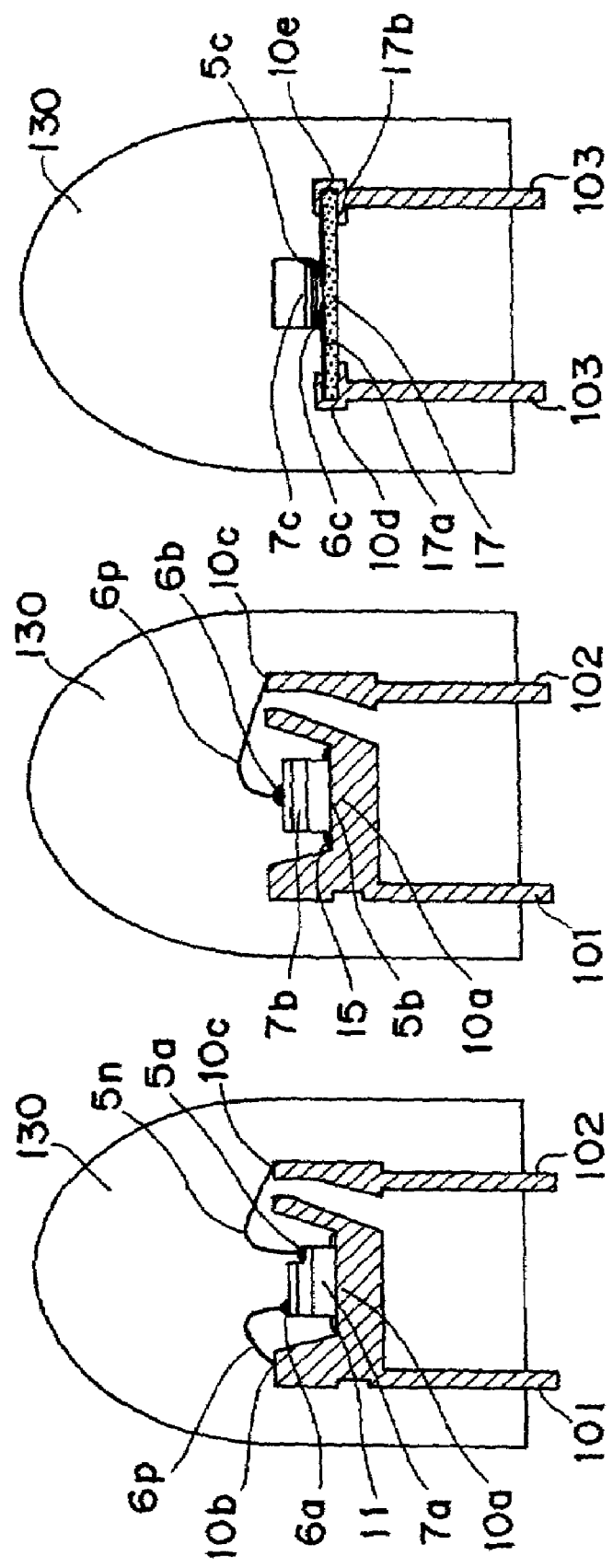

SEMICONDUCTOR LIGHT-EMITTING DEVICE AND LIGHT-EMITTING DISPLAY DEVICE THEREWITH

BACKGROUND OF THE INVENTION

The present invention relates to a semiconductor light-emitting device utilized in an LED (Light Emitting Diode) in use for a light source for a backlight of a liquid crystal display, cellular phone, mobile data terminal or the like, a display device utilized in indoor or outdoor advertisements or the like, an indicator of various portable equipment, a backlighted switch, a light source for OA (Office Automation) equipment or the like. The present invention relates, in particular, to a semiconductor light-emitting device in which the wavelength of outgoing light from a semiconductor light-emitting element is converted by using a fluorescent substance and which can be utilized as a light source of various luminous colors and a light-emitting display device using the same.

A semiconductor light-emitting device, characterized by its small size and low power consumption, can emit high-brightness light in a stable manner and thereby is widely used as a light source in various display devices. Furthermore, the semiconductor light-emitting device is also utilized as a light source for reading data records in various data processors. A semiconductor light-emitting element in use for a semiconductor light-emitting device that emits long-wavelength visible light, which has been widely used in practice, can emit high-brightness light from red to green depending on the semiconductor material, formation conditions or the like of a light-emitting layer to be used. Meanwhile, a semiconductor light-emitting element that emits short-wavelength visible light from blue to purple has been developed in recent years and started being used in general practice.

A LED display utilizing a semiconductor light-emitting device having luminous colors of, for example, three primary colors, R (Red), G (Green) and B (Blue), by using semiconductor light-emitting elements of these various luminous colors has started to be commercially available.

Furthermore, Patent Publication No. 2927279, for example, discloses a semiconductor light-emitting device wherein a semiconductor light-emitting element emitting short-wavelength visible light from blue to purple and a fluorescent substance are combined to obtain white by mixing colors of outgoing light from the semiconductor light-emitting element and light whose wavelength is converted by the fluorescent substance.

Japanese Patent Laid-Open Publication No. 10-163535 discloses a semiconductor light-emitting device wherein a semiconductor light-emitting element having blue or blue purple luminous color and one or more kinds of fluorescent substances that absorb light from this semiconductor light-emitting element to emit light in the visible range are combined to obtain high-brightness compact white luminous colors. The luminous colors of the semiconductor light-emitting element and the luminous colors of the fluorescent substances are in mutually complementary color relations. The fluorescent substance is selected so that the luminous color of the semiconductor light-emitting element and the luminous color of the fluorescent substance are added to emit white light.

Furthermore, Japanese Patent Laid-Open Publication No. 10-12925 discloses a semiconductor light-emitting device having a semiconductor light-emitting element that emits ultraviolet light and near-ultraviolet light and a fluorescent substance that emits fluorescent light by light from this semiconductor light-emitting element. This semiconductor light-emitting element is usually a semiconductor light-emitting element that emits blue light, but emits ultraviolet light and near-ultraviolet light by allowing a pulsed high current to flow. It is disclosed that a plurality of luminous colors can be obtained by using a single kind of semiconductor light-emitting element only by changing the kind of fluorescent substance.

Furthermore, Japanese Patent Laid-Open Publication No. 9-153644 discloses a dot-matrix type display device having a light-emitting layer that is formed by using a group-III nitride substance semiconductor and emits ultraviolet rays having a peak wavelength of 380 nm and three kinds of fluorescent substance layers, which receive the ultraviolet rays from this light-emitting layer and emit light in three primary colors, red, blue and green, respectively.

However, these conventional techniques have problems as described below.

A semiconductor light-emitting element having luminous colors from red to green for use in a long-wavelength visible light semiconductor light-emitting device and a semiconductor light-emitting element that emits short-wavelength visible light from blue to purple vary in materials to be used and element shapes depending on the wavelengths of their emitted light. Therefore, when semiconductor elements having different wavelengths are mounted to obtain a semiconductor light-emitting device, a plurality of different mounting materials and different mounting processes are required and the manufacturing process becomes complicated with increased costs.

Furthermore, currents to the plurality of semiconductor light-emitting elements need to be adjusted to obtain white light in a favorable color by using a plurality of semiconductor light-emitting elements having different luminous colors. Therefore, a problem arises that the semiconductor light-emitting device becomes complicated. Furthermore, when a light-emitting display device is formed by using a plurality of the semiconductor light-emitting devices, a large amount of color tones of the semiconductor light-emitting elements need to be adjusted and thus the manufacturing process becomes complicated.

Furthermore, in the semiconductor light-emitting devices disclosed in the above Patent Publication No. 2927279 and Japanese Patent Laid-Open Publication No. 10-163535, the colors of the outgoing light from the semiconductor light-emitting element and the light emitted from the fluorescent substance, which is in complementary color relations with this outgoing light, are mixed to obtain white luminous color. This results in poor light use efficiency is and an unfavorable color tone. For example, when a semiconductor light-emitting device wherein white light is obtained by mixing blue outgoing light of the semiconductor light-emitting element and yellow outgoing light of the fluorescent substance is used as a backlight of a liquid crystal display device, this white light contains a small light quantity of pure green and pure red. Therefore, there is a small quantity of light that transmits a red color filter included in the liquid crystal display device. When the liquid crystal display device performs a full color display, an impression of decoloration is generated.

Furthermore, since a pulsed high current is applied to the semiconductor light-emitting element in the semiconductor light-emitting device disclosed in Japanese Patent Laid-Open Publication No. 10-12925, the semiconductor light-emitting element is destroyed or heated and deteriorated, resulting in a short life and low reliability. Furthermore, since this semiconductor light-emitting element has its emission wavelength peak in the ultraviolet or near ultraviolet wavelength range as well as in the blue wavelength range, this blue light is mixed with the light emitted from the fluorescent substance, resulting in a poor color tone. Furthermore, when the semiconductor light-emitting device is deteriorated, a plurality of semiconductor light-emitting elements having different luminous colors are not uniformly deteriorated in brightness, but a blue-wavelength component is particularly rapidly deteriorated, resulting in changed color tones of the semiconductor light-emitting device. Furthermore, since the semiconductor light-emitting element emits light having wavelengths from the vicinity of near ultraviolet (390 nm) to the ultraviolet range on the short wavelength side, a measure for preventing influences on human bodies needs to be taken. Furthermore, since a resin for fixing and molding the semiconductor light-emitting element is also adversely affected by the light having wavelengths in the ultraviolet range, lower reliability due to deterioration of the fixing resin or lower brightness of emitted light due to blackening of the molding resin may occur.

Since the semiconductor light-emitting device disclosed in Japanese Patent Laid-Open Publication No. 9-153644 also utilizes light having an emission wavelength of 380 nm in the ultraviolet range, a measure for preventing leakage of light in the ultraviolet range needs to be taken to prevent influences to human bodies. Furthermore, a resin for fixing and molding a semiconductor light-emitting element is adversely affected, thereby resulting in deterioration of reliability and lower brightness of emitted light. Since the fluorescent substance layers for emitting three primary colors of red, blue and green are formed on a substrate as well as a semiconductor layer in this semiconductor light-emitting device, the process for manufacturing the semiconductor light-emitting device is complicated, thereby deteriorating the yield and reliability.

SUMMARY OF THE INVENTION

An object of the present invention is to provide a semiconductor light-emitting device that can emit light having a plurality of emission wavelengths, can be easily manufactured at a low cost, achieves favorable color tones without affecting human bodies and suffers almost no deterioration, and a light-emitting display device using the same.

To achieve the above object, the present invention provides a semiconductor light-emitting device constituted by mounting a semiconductor light-emitting element on a base substance, wherein the semiconductor light-emitting element has outgoing light having an emission wavelength of 390 to 420 nm; and there is included a fluorescent substance that is excited by outgoing light from the semiconductor light-emitting element and emits red light having an emission wavelength with its main emission peak in a wavelength range of 600 to 670 nm.

According to the present invention, in this semiconductor light-emitting device, the semiconductor light-emitting element has outgoing light in a short-wavelength range, wherein the human visibility is very low. In addition to this, the fluorescent substance has its main emission peak in a red emission wavelength range and thereby emits monochromatic red light. Therefore, even if the light emitted from the fluorescent substance and the outgoing light directly from the semiconductor light-emitting element are mixed, apparent color tones of the outgoing light of the fluorescent substance are hardly changed in consideration to human visibility. That is, light from the fluorescent substance is emitted from the semiconductor light-emitting device without being affected by the direct light from the semiconductor light-emitting element. Therefore, a semiconductor light-emitting device that emits monochromatic red light with a favorable color tone can be obtained.

Furthermore, since the semiconductor light-emitting element has outgoing light having emission wavelengths of 390 to 420 nm in the semiconductor light-emitting device, components of the semiconductor light-emitting device such as, for example, a sealing resin and so forth are hardly damaged and there is almost no action harmful to human bodies. If the emission wavelength of the semiconductor light-emitting element is shorter than 390 nm, for example, the sealing resin is damaged and trouble such as opacification, blackening or the like may occur. On the other hand, when the emission wavelength of the semiconductor light-emitting element is longer than 420 nm, outgoing light from this semiconductor light-emitting element has an emission wavelength in a visible range. Therefore, the color of this light is mixed with that of the outgoing light from the fluorescent substance and thus the color tone of the luminous color of the semiconductor light-emitting device is changed. Therefore, when the emission wavelength of the semiconductor light-emitting element is made in a range of 390 to 420 nm, deterioration of components of the semiconductor light-emitting device can be reduced and a semiconductor light-emitting device that achieves favorable color tones while having almost no adverse effect on human bodies can be obtained.

In one embodiment of the present invention, the fluorescent substance is composed of any one or more selected from a fluorescent substance group consisting of:

$M_2O_2S$: Eu (M is any one or more elements selected from La, Gd and Y);

$0.5MgF_2 \cdot 3.5MgO \cdot GeO_2$: Mn;

$Y_2O_3$: Eu;

Y(P, V) $O_4$: Eu; and

YVO4: Eu.

According to the above embodiment, when a semiconductor light-emitting element having outgoing light having any wavelength in a range of 390 to 420 nm is used, the fluorescent substance can be selected depending on the wavelengths of the outgoing light of the semiconductor light-emitting element. Therefore, a semiconductor light-emitting device that emits monochromatic red light having emission wavelengths with its favorable emission peak in the red wavelength range can be obtained. Since substantially all the wavelengths in the wavelength range of the outgoing light of the semiconductor light-emitting element can be converted to red wavelengths by combining a plurality of fluorescent substances, a semiconductor light-emitting device that emits monochromatic red light in high efficiency can be obtained.

The present invention also provides a semiconductor light-emitting device constituted by mounting a semiconductor light-emitting element on a base substance, wherein the semiconductor light-emitting element has outgoing light having an emission wavelength in a range of 390 to 420 nm; and there is included a fluorescent substance that is excited by outgoing light from the semiconductor light-emitting element and emits green light having an emission wavelength with its main emission peak in a wavelength range of 500 to 540 nm.

According to the present invention, in the semiconductor light-emitting device, the semiconductor light-emitting element has outgoing light in a short wavelength range, wherein the human visibility is very low. In addition to this, the fluorescent substance has its main emission peak in a green emission wavelength range and thereby emits monochromatic green light. Therefore, even if the light emitted from the fluorescent substance and the outgoing light directly from the semiconductor light-emitting element are mixed, apparent color tones of the outgoing light of the fluorescent substance are hardly changed in consideration of human visibility. That is, light from the fluorescent substance is emitted from the semiconductor light-emitting device without being affected by the direct light from the semiconductor light-emitting element. Therefore, a semiconductor light-emitting device that emits monochromatic green light with a favorable color tone can be obtained.

Furthermore, since the semiconductor light-emitting element has outgoing light having emission wavelengths of 390 to 420 nm in the semiconductor light-emitting device, components of the semiconductor light-emitting device such as, for example, a sealing resin and so forth are hardly damaged and there is almost no action harmful to human bodies. If the emission wavelength of the semiconductor light-emitting element is shorter than 390 nm, for example, the sealing resin is damaged and trouble such as opacification, blackening or the like may occur. On the other hand, when the emission wavelength of the semiconductor light-emitting element is longer than 420 nm, outgoing light from this semiconductor light-emitting element has an emission wavelength in a visible range. Therefore, the color of this light is mixed with that of the outgoing light from the fluorescent substance and the color tone of the luminous color of the semiconductor light-emitting device is changed. Therefore, when the emission wavelength of the semiconductor light-emitting element is made in a range of 390 to 420 nm, deterioration of components of the semiconductor light-emitting device can be reduced and a semiconductor light-emitting device that achieves a favorable color tone while having almost no adverse effect on human bodies can be obtained.

In one embodiment of the present invention, the fluorescent substance is composed of any one or more selected from a fluorescent substance group consisting of:
$RMg_2Al_{16}O_{27}$: Eu, Mn (R is any one or both elements selected from Sr and Ba);
$RMgAl_{10}O_{17}$: Eu, Mn (R is any one or both elements selected from Sr and Ba);
ZnS: Cu;
$SrAl_2O_4$: Eu;
$SrAl_2O_4$: Eu, Dy;
ZnO: Zn;
$Zn_2Ge_2O_4$: Mn;
$Zn_2SiO_4$: Mn; and
$Q_3MgSi_2O_8$: Eu, Mn (Q is any one or more elements selected from Sr, Ba and Ca).

According to the above embodiment, since the optimal fluorescent substance can be selected depending on the emission wavelengths of the semiconductor light-emitting element, a semiconductor light-emitting device that emits monochromatic green light having emission wavelengths with its favorable emission peak in the green wavelength range can be obtained. Since substantially all the wavelengths in the wavelength range of the outgoing light of the semiconductor light-emitting element can be converted to green wavelengths by combining a plurality of fluorescent substances, a semiconductor light-emitting device that emits monochromatic green light in high efficiency can be obtained.

The present invention provides a semiconductor light-emitting device constituted by mounting a semiconductor light-emitting element on a base substance, wherein
the semiconductor light-emitting element has outgoing light having an emission wavelength in a range of 390 to 420 nm; and
there is included a fluorescent substance that is excited by outgoing light from the semiconductor light-emitting element and emits blue light having an emission wavelength with its main emission peak in a wavelength range of 410 to 480 nm.

According to the present invention, in the semiconductor light-emitting device, the semiconductor light-emitting element has outgoing light in a short wavelength range, wherein the human visibility is very low. In addition to this, the fluorescent substance has its main emission peak in a blue emission wavelength range and thereby emits monochromatic blue light. Therefore, even if the light emitted from the fluorescent substance and the outgoing light directly from the semiconductor light-emitting element are mixed, apparent color tones of the outgoing light of the fluorescent substance are hardly changed in consideration to human visibility. That is, light from the fluorescent substance is emitted from the semiconductor light-emitting device without being affected by the direct light from the semiconductor light-emitting element. Therefore, a semiconductor light-emitting device that emits monochromatic blue light with a favorable color tone can be obtained.

Furthermore, since the semiconductor light-emitting element has outgoing light having emission wavelengths of 390 to 420 nm in the semiconductor light-emitting device, components of the semiconductor light-emitting device such as, for example, a sealing resin and so forth are hardly damaged and there is almost no action harmful to human bodies. If the emission wavelength of the semiconductor light-emitting element is shorter than 390 nm, for example, the sealing resin is damaged and trouble such as opacification, blackening or the like may occur. On the other hand, when the emission wavelength of the semiconductor light-emitting element is longer than 420 nm, outgoing light from this semiconductor light-emitting element has emission wavelengths in a visible range. Therefore, the color of this light is mixed with that of the outgoing light from the fluorescent substance and the color tone of the luminous color of the semiconductor light-emitting device is changed. Therefore, when the emission wavelength of the semiconductor light-emitting element is made in a range of 390 to 420 nm, deterioration of components of the semiconductor light-emitting device can be reduced and a semiconductor light-emitting device that achieves a favorable color tone while having almost no adverse effect on human bodies can be obtained.

In one embodiment of the present invention, the fluorescent substance is composed of any one or more selected from a fluorescent substance group consisting of:
$A_{10}(PO_4)_6Cl_2$: Eu (A is any one or more elements selected from Sr, Ca, Ba, Mg and Ce);
$XMg_2Al_{16}O_{27}$: Eu (X is any one or both elements selected from Sr and Ba);
$XMgAl_{10}O_{17}$: Eu (X is any one or both elements selected from Sr and Ba);
ZnS: Ag;
$Sr_{10}(PO_4)_6Cl_2$: Eu;
$Ca_{10}(PO_4)_6F_2$: Sb;

$Z_3MgSi_2O_8$: Eu (Z is any one or more elements selected from Sr, Ca and Ba);
$SrMgSi_2O_8$: Eu;
$Sr_2P_2O_7$: Eu; and
$CaAl_2O_4$: Eu, Nd.

According to the above embodiment, since the optimal fluorescent substance can be selected depending on the emission wavelengths of the semiconductor light-emitting element, a semiconductor light-emitting device that emits monochromatic blue light having emission wavelengths with its favorable emission peak in the blue wavelength range can be obtained. Since substantially all the wavelengths in the wavelength range of the outgoing light of the semiconductor light-emitting element can be converted to blue wavelengths by combining a plurality of fluorescent substances, a semiconductor light-emitting device that achieves monochromatic blue light in high efficiency can be obtained.

The present invention provides a semiconductor light-emitting device constituted y mounting a semiconductor light-emitting element on a base substance, wherein
the semiconductor light-emitting element has outgoing light having an emission wavelength in a range of 390 to 420 nm; and
there is included a fluorescent substance that is excited by outgoing light from the semiconductor light-emitting element and emits blue green light having an emission wavelength with its main emission peak in a wavelength range of 480 to 500 nm.

According to the present invention, in the semiconductor light-emitting device, the semiconductor light-emitting element has outgoing light in a short wavelength range, wherein the human visibility is very low. In addition to this, the fluorescent substance has its main emission peak in a blue green emission wavelength range and thereby emits monochromatic blue green light. Therefore, even if the light emitted from the fluorescent substance and the outgoing light directly from the semiconductor light-emitting element are mixed, apparent color tones of the outgoing light of the fluorescent substance are hardly changed in consideration to human visibility. That is, light from the fluorescent substance is emitted from the semiconductor light-emitting device without being affected by the direct light from the semiconductor light-emitting element. Therefore, a semiconductor light-emitting device that emits monochromatic blue green light with a favorable color tone can be obtained.

Furthermore, since the semiconductor light-emitting element has outgoing light having emission wavelengths of 390 to 420 nm in the semiconductor light-emitting device, components of the semiconductor light-emitting device such as, for example, a sealing resin and so forth are hardly damaged and there is almost no action harmful to human bodies. If the emission wavelength of the semiconductor light-emitting element is shorter than 390 nm, for example, the sealing resin is damaged and trouble such as opacification, blackening or the like may occur. On the other hand, when the emission wavelength of the semiconductor light-emitting element is longer than 420 nm, outgoing light from this semiconductor light-emitting element has an emission wavelength in a visible range. Therefore, the color of this light is mixed with that of the outgoing light from the fluorescent substance and the color tone of the luminous color of the semiconductor light-emitting device is changed. Therefore, when the emission wavelength of the semiconductor light-emitting element is made in a range of 390 to 420 nm, deterioration of components of the semiconductor light-emitting device can be reduced and a semiconductor light-emitting device that achieves a favorable color tone while having almost no adverse effect on human bodies can be obtained.

In one embodiment of the present invention, the fluorescent substance is composed of any one or more selected from a fluorescent substance group consisting of:
$Sr_4Al_{14}O_{25}$: Eu;
$Sr_4Al_{14}O_{25}$: Eu, Dy;
$L_{10}(PO_4)_6Cl_2$: Eu (L is any one or more elements selected from Ba, Ca and Mg); and
$Sr_2Si_3O_8.2SrCl_2$: Eu.

According to the above embodiment, since the optimal fluorescent substance can be selected depending on the emission wavelength of the semiconductor light-emitting element, a semiconductor light-emitting device that emits monochromatic blue green light having emission wavelengths with its favorable emission peak in the blue green wavelength range can be obtained. Since substantially all the wavelengths in the wavelength range of the outgoing light of the semiconductor light-emitting element can be converted to blue green wavelengths by combining a plurality of fluorescent substances, a semiconductor light-emitting device that achieves monochromatic blue green light in high efficiency can be obtained.

The present invention provides a semiconductor light-emitting device constituted by mounting a semiconductor light-emitting element on a base substance, wherein
the semiconductor light-emitting element has outgoing light having an emission wavelength in a range of 390 to 420 nm; and
there is included a fluorescent substance that is excited by outgoing light from the semiconductor light-emitting element and emits orange light having an emission wavelength with its main emission peak in a wavelength range of 570 to 600 nm.

According to the present invention, in the semiconductor light-emitting device, the semiconductor light-emitting element has outgoing light in a short wavelength range, wherein the human visibility is very low. In addition to this, the fluorescent substance has its main emission peak in an orange emission wavelength range and thereby emits monochromatic orange light. Therefore, even if the light emitted from the fluorescent substance and the outgoing light directly from the semiconductor light-emitting element are mixed, apparent color tones of the outgoing light of the fluorescent substance are hardly changed in consideration to human visibility. That is, light from the fluorescent substance is emitted from the semiconductor light-emitting device without being affected by the direct light from the semiconductor light-emitting element. Therefore, a semiconductor light-emitting device that emits monochromatic orange light with a favorable color tone can be obtained.

Furthermore, since the semiconductor light-emitting element has outgoing light having emission wavelengths of 390 to 420 nm in the semiconductor light-emitting device, components of the semiconductor light-emitting device such as, for example, a sealing resin and so forth are hardly damaged and there is almost no action harmful to human bodies. If the emission wavelength of the semiconductor light-emitting element is shorter than 390 nm, for example, the sealing resin is damaged and trouble such as opacification, blackening or the like may occur. On the other hand, when the emission wavelength of the semiconductor light-emitting element is longer than 420 nm, outgoing light from this semiconductor light-emitting element has emission wavelengths in a visible range. Therefore, the color of this light is mixed with that of the outgoing light from the fluorescent substance and the color tone of the luminous color of the semiconductor light-emitting device is changed. Therefore, when the emission wavelength of the semiconductor light-emitting element is made in a range of 390 to 420 nm, deterioration of components of the semiconductor light-emitting device can be reduced and a semiconductor light-emitting device that achieves a favorable color tone while having almost no adverse effect on human bodies can be obtained.

In one embodiment of the present invention, the fluorescent substance is composed of any one or more selected from a fluorescent substance group consisting of:

ZnS: Mn; and

ZnS: Cu, Mn, Co.

According to the above embodiment, since the optimal fluorescent substance can be selected depending on the wavelength range of the semiconductor light-emitting element, a semiconductor light-emitting device that emits monochromatic orange light having emission wavelengths with its favorable emission peak in the orange wavelength range can be obtained.

In one embodiment of the present invention, a sealing resin for sealing at least a part of the base substance and the semiconductor light-emitting element is included; and the sealing resin contains the fluorescent substance.

According to the above embodiment, since a sealing resin for sealing the semiconductor light-emitting element contains a fluorescent substance, the wavelength of outgoing light from the semiconductor light-emitting element is inevitably converted. Therefore, use efficiency of light from the semiconductor light-emitting element is favorable. Furthermore, since the fluorescent substance can be disposed while the sealing resin is formed, a process for disposing a fluorescent substance separately is not required. Therefore, the semiconductor light-emitting device can be easily manufactured.

Furthermore, according to this semiconductor light-emitting device, a semiconductor device that emits light having desired emission wavelengths can be obtained without changing structures of the semiconductor light-emitting element and the semiconductor light-emitting device by combining a semiconductor light-emitting element having emission wavelengths in a certain wavelength range and a predetermined fluorescent substance. That is, since a semiconductor light-emitting device having desired emission wavelengths can be obtained only by changing the fluorescent substance in the same manufacturing process, the manufacturing cost for the semiconductor light-emitting device can be largely reduced.

In one embodiment of the present invention, the base substance is a lead frame having a cup-shaped mount section;

the semiconductor light-emitting element is disposed at the bottom of the cup-shaped mount section of the lead frame and electrically connected to another lead frame by wire bonding; and at least a part of the two lead frames and the semiconductor light-emitting element are sealed with the sealing resin.

According to the above embodiment, since the wavelength of outgoing light from the semiconductor light-emitting element collected by the cup-shaped mount section is reliably converted by a sealing resin containing the fluorescent substance, a semiconductor light-emitting device with favorable directivity, light-emitting efficiency and color tones can be obtained.

In one embodiment of the present invention, the base substance is an insulator connected to ends of a pair of lead frames;

the semiconductor light-emitting element is connected to metallic wiring formed on the insulator; and at least a part of the pair of lead frames, the insulator and the semiconductor light-emitting element are sealed with the sealing resin.

According to the above embodiment, since the semiconductor light-emitting element is directly connected to the metallic wiring on the substrate with, for example, a metal bump or the like, work for connecting the semiconductor light-emitting element and the lead frames with a metallic wire or the like can be omitted. Further, the wavelength of outgoing light from the semiconductor light-emitting element is reliably converted by a fluorescent substance contained in the sealing resin. Therefore, a semiconductor light-emitting device with favorable manufacturing efficiency, light-emitting efficiency and color tones can be obtained.

In one embodiment of the present invention, the base substance is a lead frame having a cup-shaped mount section;

the semiconductor light-emitting element is disposed at the bottom of the cup-shaped mount section of the lead frame and electrically connected to another lead frame by wire bonding;

the fluorescent substance is filled in the cup-shaped mount section; and at least a part of the two lead frames, the semiconductor light-emitting element and the fluorescent substance are sealed with a sealing resin.

According to the above embodiment, since a fluorescent substance is filled in the cup-shaped mount section, into which light from the semiconductor light-emitting element is collected, the wavelength of the light from the semiconductor light-emitting element is reliably converted, thereby improving light use efficiency. Furthermore, since an area in which the fluorescent substance is disposed is smaller than in a semiconductor light-emitting device that does not collect light from the semiconductor light-emitting element, the amount of the fluorescent substance to be used can be reduced.

In one embodiment of the present invention, the base substance is a lead frame having a cup-shaped mount section;

the semiconductor light-emitting element is disposed at the bottom of the cup-shaped mount section of the lead frame and electrically connected to another lead frame by wire bonding;

a coating member is filled in the cup-shaped mount section and the fluorescent substance is disposed on the coating member; and at least a part of the two lead frames, the semiconductor light-emitting element, the coating member and the fluorescent substance are sealed with a sealing resin.

According to the above embodiment, since the fluorescent substance is disposed on the coating member filled in the mount section, the amount of the fluorescent substance to be used can be reduced as compared with a case where the fluorescent substance is filled in the whole mount section. Furthermore, distances between a light-emitting section of the semiconductor light-emitting element and the fluorescent substance are made substantially uniform by the coating member, a semiconductor light-emitting device that emits uniform alight without uneven coloring can be obtained. Furthermore, since the semiconductor light-emitting element and the fluorescent substance are made distant by the coating member, there is almost no electrical or thermal deterioration of the fluorescent substance due to the semiconductor light-emitting element.

In one embodiment of the present invention, the base substance is a substrate provided with metallic wiring;
the semiconductor light-emitting element is electrically connected the metallic wiring on the substrate;
a sealing resin for sealing the semiconductor light-emitting element is included; and
the sealing resin contains the fluorescent substance.

According to the above embodiment, in this semiconductor light-emitting device, semiconductor light-emitting elements of the same shape or one kind are connected onto the metallic wiring with, for example, a metallic wire of Au, Al, Cu or the like or directly connected with metal bumps or the like without using metallic wires or the like. Therefore, as compared with a conventional case, wherein semiconductor light-emitting devices of different shapes are manufactured by using semiconductor light-emitting elements of different shapes corresponding to respective luminous colors, the process of manufacturing the semiconductor light-emitting device is simple. In this semiconductor light-emitting device, since a semiconductor light-emitting device having desired emission wavelengths can be obtained only by disposing a predetermined fluorescent substance corresponding to a desired wavelength, a semiconductor light-emitting device can be more easily manufactured at a lower cost than a conventional device.

In one embodiment of the present invention, the base substance is a substrate provided with metallic wiring;
the semiconductor light-emitting element is electrically connected to the metallic wiring on the substrate and disposed in a recessed portion; and
the fluorescent substance is filled in the recessed portion.

According to the above embodiment, since the fluorescent substance is filled in the recessed portion in the substrate, the amount of the fluorescent substance to be used can be reduced and a semiconductor light-emitting device that has favorable light-emitting efficiency and emits monochromatic light with favorable color tones can be obtained at a low manufacturing cost.

In one embodiment of the present invention, the recessed portion is formed by a frame disposed on the substrate.

According to the above embodiment, since a frame is disposed on the substrate to form the recessed portion, processing work for, for example, cutting the substrate to form the recessed portion can be omitted. Furthermore, when the shape of a side surface of the frame on the semiconductor light-emitting element side is processed into, for example, a shape in which outgoing light from the semiconductor light-emitting element is collected, efficiency of converting the wavelength of the outgoing light is further improved as well as directivity of the semiconductor light-emitting device. As a result, a semiconductor light-emitting device that has favorable light-emitting efficiency and emits monochromatic light with favorable color tones can be obtained.

In one embodiment of the present invention, the base substance is a substrate provided with metallic wiring;
the semiconductor light-emitting element is electrically connected to the metallic wiring on the substrate and disposed in a recessed portion;
a sealing resin is filled in the recessed portion; and
the fluorescent substance is disposed on the sealing resin.

According to the above embodiment, since the fluorescent substance is disposed on the sealing resin, a semiconductor light-emitting device having desired emission wavelengths can be obtained with a further reduced amount of the fluorescent substance to be used as compared with a case where the fluorescent substance is filled inside the recessed portion in the substrate. Furthermore, distances between a light-emitting section of the semiconductor light-emitting element and the fluorescent substance is made substantially uniform by the sealing resin, a semiconductor light-emitting device that emits uniform light without uneven coloring can be obtained. Furthermore, since the semiconductor light-emitting element and the fluorescent substance are made distant by the sealing resin, electrical and thermal effects of the semiconductor light-emitting element on the fluorescent substance can be reduced, thereby stabilizing performance of the semiconductor light-emitting device.

In one embodiment of the present invention, the base substance is a substrate provided with metallic wiring;
the semiconductor light-emitting element is electrically connected to the metallic wiring on the substrate;
a reflector for reflecting at least a part of outgoing light from the semiconductor light-emitting element is included;
a sealing resin for sealing the semiconductor light-emitting element and transmitting reflected light from the reflector is included; and
the fluorescent substance is contained in the sealing resin.

According to the above embodiment, in this semiconductor light-emitting device, semiconductor light-emitting elements of the same shape or one kind are connected onto the metallic wiring on the substrate with, for example, metallic wires of Au, Al, Cu or the like or directly connected with metal bumps or the like without using metallic wires or the like. Therefore, as compared with a conventional case, wherein semiconductor light-emitting devices of different shapes are manufactured by using semiconductor light-emitting elements of different shapes corresponding to respective luminous colors, the process of manufacturing the semiconductor light-emitting device is simple. In this semiconductor light-emitting device, since a semiconductor light-emitting device having desired emission wavelengths can be obtained only by disposing a predetermined fluorescent substance corresponding to a desired wavelength, a semiconductor light-emitting device can be more easily manufactured at a lower cost than a conventional device.

In one embodiment of the present invention, the base substance is a substrate provided with metallic wiring;
the semiconductor light-emitting element is electrically connected to the metallic wiring on the substrate;
a reflector for reflecting at least a part of outgoing light from the semiconductor light-emitting element is included;
a shielding body for shielding light directly emitted from the semiconductor light-emitting element to the outside of the semiconductor light-emitting device is included;
a sealing resin for sealing the semiconductor light-emitting element and transmitting reflected light from the reflector is included; and
a layer of the fluorescent substance is formed on a surface of the reflector that reflects light.

According to the above embodiment, since a layer of the fluorescent substance is formed on a surface of the reflector that reflects light, the wavelength of light reflected by the reflector is reliably converted. Furthermore, outgoing light from the semiconductor light-emitting element is reflected on the reflecting surface and emitted to the outside of the semiconductor light-emitting device while leakage outside the semiconductor light-emitting device is prevented by the shielding body, the wavelengths of almost all the light are converted. Therefore, this semiconductor light-emitting device can efficiently obtain desired luminous colors by using a small amount of the fluorescent substance formed only on the reflecting surface. Furthermore, since the fluorescent substance layer is formed on a reflecting surface of the reflector with a predetermined distance from the semiconductor light-emitting element, distances between the light-emitting section of the semiconductor light-emitting element and the fluorescent substance become substantially uniform and a semiconductor light-emitting device that emits uniform light without uneven coloring can be obtained. Furthermore, since the semiconductor light-emitting element and the fluorescent substance are made distant, electrical and thermal effects of the semiconductor light-emitting element on the fluorescent substance are relieved, thereby stabilizing performance of the semiconductor light-emitting device.

In one embodiment of the present invention, the base substance is a substrate provided with metallic wiring;
the semiconductor light-emitting element is electrically connected to the metallic wiring on the substrate;
at least a light-emitting section of the semiconductor light-emitting element is disposed in a recessed portion in the substrate;
a reflector for reflecting at least a part of outgoing light from the semiconductor light-emitting element is included;
a sealing resin for sealing the semiconductor light-emitting element and transmitting reflected light from the reflector is included; and
a layer of the fluorescent substance is formed on a surface of the reflector that reflects light.

According to the above embodiment, since the semiconductor light-emitting element is disposed in the recessed portion, light from the semiconductor light-emitting element is not emitted directly to the outside of the semiconductor light-emitting device, but inevitably reflected by the reflector so that its wavelength is converted and then emitted to the outside of the semiconductor light-emitting device. Therefore, this semiconductor light-emitting device can emit outgoing light with favorable color tones.

In one embodiment of the present invention, the base substance is a substrate provided with metallic wiring;
the semiconductor light-emitting element is electrically connected to the metallic wiring on the substrate;
a reflector for reflecting at least a part of outgoing light from the semiconductor light-emitting element is included;
a sealing resin for sealing the semiconductor light-emitting element and transmitting reflected light from the reflector is included; and
a layer of the fluorescent substance is formed on a surface of the sealing resin that reflects light.

According to the above embodiment, by a layer of the fluorescent substance formed on a surface of the sealing resin that reflects light, the wavelength of outgoing light from the semiconductor light-emitting element is converted immediately before emitted from the semiconductor light-emitting device. That is, since the wavelengths of all the light from semiconductor light-emitting device are converted, a semiconductor light-emitting device with favorable light use efficiency can be obtained. Furthermore, since the fluorescent substance layer is positioned with a predetermined distance from the semiconductor light-emitting element, distances between the light-emitting section of the semiconductor light-emitting element and the fluorescent substance become substantially uniform and thus a semiconductor light-emitting device that emits uniform light without uneven coloring can be obtained. Furthermore, since the semiconductor light-emitting element and the fluorescent substance are made distant, electrical and thermal effects of the semiconductor light-emitting element on the fluorescent substance are relieved, thereby stabilizing performance of the semiconductor light-emitting device.

In one embodiment of the present invention, the semiconductor light-emitting element has outgoing light having emission wavelengths of 390 to 420 nm;
a first fluorescent substance, a second fluorescent substance and a third fluorescent substance are included;
the first fluorescent substance has red outgoing light having emission wavelengths with its main emission peak in a wavelength range of 600 to 670 nm;
the second fluorescent substance has green outgoing light having emission wavelengths with its main emission peak in a wavelength range of 500 to 540 nm;
the third fluorescent substance has blue outgoing light having emission wavelengths with its main emission peak in a wavelength range of 410 to 480 nm; and
the sum of colors of light emitted from the first, second and third fluorescent substances is a white color.

According to the above constitution, the semiconductor light-emitting element has a short wavelength range, wherein human visibility is very low. In addition to this, light emitted from the first to third fluorescent substances is monochromatic light having their main peak emission wavelengths in the red, green and blue wavelength ranges, respectively. Therefore, even if outgoing light from the first to third fluorescent substances and outgoing light direct from the semiconductor light-emitting element are mixed, apparent color tones of the outgoing light of the semiconductor light-emitting device are hardly changed in consideration to human visibility. That is, no light from the first to third fluorescent substances is affected by direct light from the semiconductor light-emitting element. Therefore, a semiconductor light-emitting device having a white luminous color with a favorable color tone can be obtained. Furthermore, among outgoing light from the semiconductor light-emitting device, light directly from the semiconductor light-emitting element to the outside of the semiconductor light-emitting device is not mixed with light from the fluorescent substances in color in the human visible range. Therefore, even though light-emitting performance of the semiconductor light-emitting element is deteriorated with a secular change after use of the semiconductor light-emitting device for a long period, only the brightness of the semiconductor light-emitting device is deteriorated, but the color tones are not changed. Therefore, the semiconductor light-emitting device can stably obtain light having white light with a favorable color tone.

Furthermore, since the semiconductor light-emitting element has outgoing light having emission wavelengths of 390 to 420 nm in this semiconductor light-emitting device, components of the semiconductor light-emitting device such as, for example, a sealing resin and so forth are hardly damaged and there is almost no action harmful to human bodies. If the emission wavelength of the semiconductor light-emitting element is shorter than 390 nm, for example, the sealing resin is damaged and trouble such as opacification, blackening or the like may occur. Therefore, when the emission wavelengths of the semiconductor light-emitting element are made in a range of 390 to 420 nm, deterioration of components of the semiconductor light-emitting device can be reduced and a semiconductor light-emitting device that achieves a favorable color tone while having almost no adverse effect to human body can be obtained.

In one embodiment of the present invention, the first fluorescent substance is composed of any one or more selected from a fluorescent substance group consisting of:

$M_2O_2S$: Eu (M is any one or more elements selected from La, Gd and Y);

$0.5MgF_2.3.5MgO.GeO_2$: Mn;

$Y_2O_3$: Eu, $Y(P, V) O_4$: Eu; and $YVO_4$: Eu;

the second fluorescent substance is composed of any one or more selected from a fluorescent substance group consisting of:

$RMg_2Al_{16}O_{27}$: Eu, Mn (R is any one or both elements selected from Sr and Ba);

$RMgAl_{10}O_{17}$: Eu, Mn (R is any one or both elements selected from Sr and Ba);

ZnS: Cu;

$SrAl_2O_4$: Eu;

$SrAl_2O_4$: Eu, Dy;

ZnO: Zn;

$Zn_2GeO_4$: Mn;

$Zn_2SiO_4$: Mn; and $Q_3MgSi_2O_8$: Eu, Mn (Q is any one or more elements selected from Sr, Ba and Ca); and the third fluorescent substance is composed of any one or more selected from a fluorescent substance group consisting of:

$A_{10}(PO_4)_6Cl_2$: Eu (A is any one or more elements selected from Sr, Ca, Ba, Mg and Ce);

$XMg_2Al_{16}O_{27}$: E (X is any one or both elements selected from Sr and Ba);

$XMgAl_{10}O_{17}$: Eu (X is any one or both elements selected from Sr and Ba);

ZnS: Ag;

$Sr_{10}(PO_4)_6Cl_2$: Eu;

$Ca_{10}(PO_4)_6F_2$: Sb;

$Z_3MgSi_2O_8$: Eu (Z is any one or more elements selected from Sr, Ca and Ba);

$SrMgSi_2O_8$: Eu;

$Sr_2P_2O_7$: Eu;

$CaAl_2O_4$: Eu, Nd.

According to the above embodiment, when a semiconductor light-emitting element having any emission wavelength in a range of 390 to 420 nm is used, monochromatic red, green or blue emission light can be obtained by selecting an appropriate fluorescent substance from a plurality of fluorescent substances corresponding to emission wavelengths of the semiconductor light-emitting element. Consequently, red, green and blue wavelength light beams are appropriately mixed and a white luminous color with a favorable color tone can be obtained. Furthermore, substantially light of all the wavelengths in the wavelength range of the semiconductor light-emitting element can be converted to red, green or blue wavelengths by combining a plurality of fluorescent substances. Therefore, use efficiency of the outgoing light of the semiconductor light-emitting element is improved and a semiconductor light-emitting device that emits white light in high efficiency can be obtained.

In one embodiment of the present invention, assuming the total amount as 100 weight %, the first fluorescent substance is between 50 weight % and 70 weight % inclusive;

the second fluorescent substance is between 7 weight % and 20 weight % inclusive; and the third fluorescent substance is between 20 weight % and 30 weight % inclusive.

According to the above embodiment, since the first fluorescent substance is between 50 weight % and 70 weight % inclusive, the second fluorescent substance is 7 weight % and 20 weight % inclusive and the third fluorescent substance is 20 weight % and 30 weight % inclusive, brightness of red light and blue light emitted from the first fluorescent substance and the third fluorescent substance, respectively, which have low visibility, is enhanced as compared with green light emitted from the second fluorescent substance. Therefore, in consideration to human visibility, a semiconductor light-emitting device that emits white light with a favorable color tone can be obtained.

Here, when the mixture proportion of the first fluorescent substance is less than 50 weight %, the luminous color of the semiconductor light-emitting device becomes white with a color tone tinged with green, whereas it becomes white with a color tone tinged with red when the mixture proportion of the first fluorescent substance is more than 70 weight %. Furthermore, when the mixture proportion of the second fluorescent substance is less than 7 weight %, the luminous color of the semiconductor light-emitting device becomes white with a color tone tinged with red, whereas it becomes white with a color tone tinged with green when the mixture proportion of the second fluorescent substance is more than 20 weight %. Furthermore, when the mixture proportion of the third fluorescent substance is less than 20 weight %, the luminous color of the semiconductor light-emitting device becomes white with a color tone tinged with red, whereas it becomes white with a color tone tinged with green when the mixture proportion of the third fluorescent substance is more than 30 weight %.

In one embodiment of the present invention, the sealing resin contains the first, second and third fluorescent substances; and the proportion of the total weight of the first, second and third fluorescent substances to the weight of the sealing resin is between 0.5 and 1 inclusive.

According to the above embodiment, when the proportion of the total weight of the first, second and third fluorescent substances to the weight of the sealing resin is between 0.5 and 1 inclusive, a semiconductor light-emitting device that emits white light close to natural light can be obtained. When the proportion is more than 1, outgoing light from the semiconductor light-emitting device becomes brighter and the color tone becomes pale. Meanwhile, when the proportion is less than 0.5, outgoing light from the semiconductor light-emitting device becomes darker and the color tone is tinged with red.

In one embodiment of the present invention, a light-emitting display device comprises;

a light source using the semiconductor light-emitting device according to the present invention;

a light guiding plate for guiding light from the light source; and red, green and blue color filters for transmitting light from the light guiding plate and dividing the light; the light-emitting display device, wherein outgoing light from the semiconductor light-emitting device has a wavelength distribution that matches spectral characteristics of the color filters.

According to the embodiment, since the outgoing light from the semiconductor light-emitting device has a wavelength distribution that matches spectral characteristics of the red, green and blue color filters, the color filters divide light into light having emission wavelengths with its peak in a red color wavelength range, light having emission wavelengths with its peak in a green color wavelength range and light having emission wavelengths with its peak in a blue color wavelength range while each having appropriate brightness. Therefore, a semiconductor light-emitting device that has light favorable use efficiency and high brightness can be obtained.

In one embodiment of the present invention, at least one of the following is adjusted so that the wavelength distribution of the outgoing light from the semiconductor light-emitting device matches spectral characteristics of the color filters:

the emission wavelength of the semiconductor light-emitting element;

the emission wavelength of the first fluorescent substance;

the emission wavelength of the second fluorescent substance;

the emission wavelength of the third fluorescent substance;

the mixture proportions of the first, second and third fluorescent substances; and the proportion of the total weight of the first, second and third fluorescent substances to the weight of the sealing resin.

According to the above embodiment, since the outgoing light from the semiconductor light-emitting device is reliably and effectively adjusted so as to match spectral characteristics of the color filters, the outgoing light from the light-emitting display device is divided into substantially red light, green light and blue light, which have monochromatic colors and relatively high brightness, by the color filters. Therefore, the light-emitting display device has no decoloration or the like and can achieve a full color display with high brightness and contrast.

In one embodiment of the present invention, the light-emitting display device is a liquid crystal display device.

According to the above embodiment, a liquid crystal display device having almost no decoloration, but high brightness and contrast can be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 8A, 8B and 8C are cross sectional views showing a semiconductor light-emitting device according to a first embodiment of the invention;

DETAILED DESCRIPTION OF THE PREFERRED EMBODIMENTS

Embodiments of the present invention are described below in more detail with reference to the accompanying drawings.

Figure 1A:
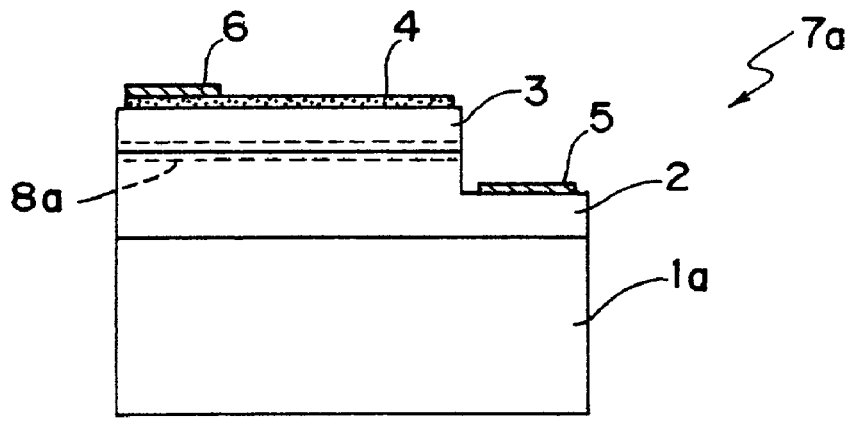
FIGS. 1A, 1B and 1C are cross sectional views showing a semiconductor light-emitting element used in the present invention.
Figure 1B:
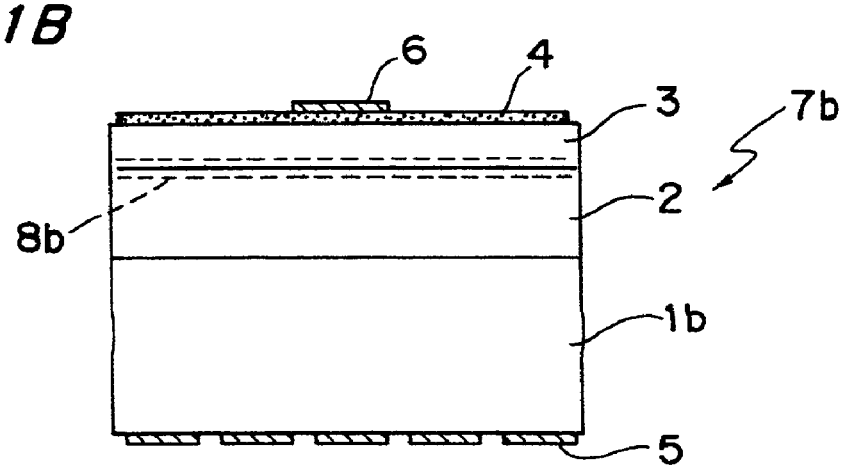
Figure 1C:
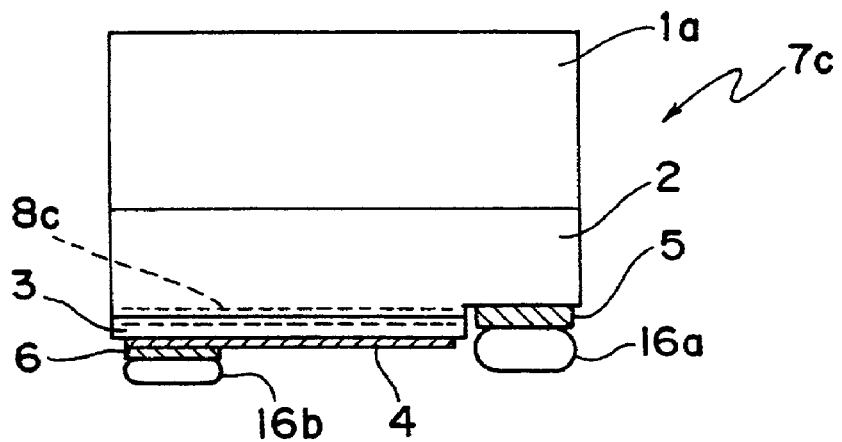

FIGS. 1A, 1B and 1C are cross sectional views showing a semiconductor light-emitting element used in embodiments of the present invention.

FIG. 1A is a cross sectional view showing a semiconductor light-emitting element having a substrate composed of an insulating semiconductor material. In this semiconductor light-emitting element 7a, an N-type gallium nitride compound semiconductor layer 2, a P-type gallium nitride compound semiconductor layer 3 and a P-type layer electrode 4 composed of a metallic thin film or a transparent conductive film are successively laminated on an insulating sapphire substrate 1a. An N-type pad electrode 5 is formed on an exposed surface of the N-type gallium nitride compound semiconductor layer 2 formed on the right in FIG. 1A and a P-type pad electrode 6 is formed on the surface of the P-type layer electrode 4. When a current is allowed to flow between the N-type pad electrode 5 and the P-type pad electrode 6, light is emitted from a light-emitting region 8a.

FIG. 1B is a cross sectional view showing a semiconductor light-emitting element having a substrate composed of a conductive semiconductor material. In this semiconductor light-emitting element 7b, an N-type gallium nitride compound semiconductor layer 2, a P-type gallium nitride compound semiconductor layer 3 and a P-type layer electrode 4 composed of a metallic thin film or a transparent conductive film are successively laminated on a conductive gallium nitride semiconductor substrate 1b. An N-type pad electrode 5 is formed on the lower surface of the semiconductor substrate 1b while a P-type pad electrode 6 is formed on the upper surface of the P-type layer electrode 4. When a current is allowed to flow between the N-type pad electrode 5 and the P-type pad electrode 6, light is emitted from a light-emitting region 8b.

FIG. 1C is a cross sectional view showing a semiconductor light-emitting element of a type wherein light is allowed to pass through a substrate and taken out. In this semiconductor light-emitting element 7c, an N-type gallium nitride compound semiconductor layer 2, a P-type gallium nitride compound semiconductor layer 3 and a P-type layer electrode 4 composed of a metallic thin film or a transparent conductive film are successively laminated on an insulating sapphire substrate 1a (under the sapphire substrate 1a in FIG. 1C). An N-type pad electrode 5 is formed on an exposure surface of the N-type gallium nitride compound semiconductor layer 2 and a P-type pad electrode 6 is formed on a surface of the P-type layer electrode 4. As shown in FIG. 1C, the N-type pad electrode 5 and the P-type pad electrode 6 are directly ball-bonded to metallic wiring on a submount (not shown) or the like disposed below the semiconductor light-emitting element 7c with, for example, metal bumps 16a, 16b composed of Au or the like. When a current is allowed to flow between the N-type pad electrode 5 and the P-type pad electrode 6, light is emitted from a light-emitting region 8c. This emission light is transmitted through the sapphire substrate 1a and emitted upwards in FIG. 1C.

It is noted that the insulating sapphire substrate 1a of the semiconductor light-emitting elements 7a, 7c may be composed of other materials such as ZnO, GaN, SiC, ZnSe and so forth. The conductive gallium nitride semiconductor substrate 1b in the semiconductor light-emitting element 7b may be composed of other materials such as SiC, ZnSe, Si and so forth. In the semiconductor light-emitting element 7b having this conductive semiconductor substrate 1b, an electrode can also be formed on the lower surface of the semiconductor substrate 1b so that electrodes are formed on both the upper and lower surfaces of the semiconductor light-emitting element 7b. Therefore, a large light-emitting region can be formed on the semiconductor layer having the same size and this light-emitting element can be easily mounted onto a lead frame or a mount substrate as compared with the semiconductor light-emitting elements 7a, 7b, which have an insulator substrate 1a and two electrodes disposed on one surface thereof.

As the material of the semiconductor layer in the semiconductor light-emitting elements 7a, 7b, 7c, nitride compound semiconductor $(In_xGa_yAl_zN$ $(x+y+z=1, 0 \leq x \leq 1, 0 \leq y \leq 1, 0 \leq z \leq 1))$ can be preferably utilized, but, in addition to this, semiconductor materials such as SiC, ZnSe and so forth may be used.

The semiconductor light-emitting elements 7a, 7b, 7c emit light in a wavelength range of 390 nm to 420 nm, wherein human visibility of light is very low. Therefore, when a fluorescent substance for converting light in this wavelength range into light in other wavelengths, only colors of the light converted by the fluorescent substance can be recognized as luminous colors. Thus, a semiconductor light-emitting device having favorable color tones can be obtained. When the wavelength of light from the semiconductor light-emitting element is longer than 420 nm, the light is easily recognized by human eyes as visible light. Therefore, the light whose wavelength is converted by the fluorescent substance is mixed with outgoing light directly from the semiconductor light-emitting element and thus the color tone of the luminous color is deteriorated. Furthermore, when the wavelength of light from the semiconductor light-emitting element is shorter than 390 nm, this light becomes ultraviolet rays harmful to human bodies and has adverse effects on a resin portion used in the semiconductor light-emitting device. For example, lower brightness due to blackening of a mold resin or lower reliability due to deterioration of the resin may occur.

Hereafter, the fluorescent substances used in the semiconductor light-emitting device of the present invention are described in detail.

Tables 1 and 2 given below show the results of evaluation of brightness of light emitted by exciting various fluorescent substances by using a semiconductor light-emitting element manufactured with a gallium nitride compound semiconductor having an emission wavelength peak at 410 nm as a light-emitting element. These tables also show peak wavelengths (nm) of light emitted by exciting the fluorescent substances. The brightness of emission light was evaluated by comparing luminous brightness between respective fluorescent substances in luminous colors of red, green, blue, blue green and orange. Symbol ⊚ was given to superior light emission. Symbol ○ was given to ordinary light emission. Symbol Δ was given to slightly inferior light emission. Symbol x was given to inferior light emission. Table 1 shows peak wavelengths of fluorescent substances having luminous colors in red and green and the results of evaluation in their brightness. Table 2 shows peak wavelengths of fluorescent substances having luminous colors in blue, blue green and orange and the results of evaluation in their brightness.

TABLE 1

| Luminescent color | Luminescent color | Emission peak wavelength (nm) | Evaluation |
|---|---|---|---|
| Red | $La_2O_2S:Eu$ | 623 | ⊚ |
|  | $Gd_2O_2S:Eu$ | 625 | ○ |
|  | $Y_2O_2S:Eu$ | 626 | Δ |

TABLE 1-continued

| Luminescent color | Luminescent color | Emission peak wavelength (nm) | Evaluation |
|---|---|---|---|
| | $0.5MgF_2 \cdot 3.5MgO \cdot GeO_2$:Mn | 658 | ◉ |
| | $Y_2O_3$:Eu | 611 | Δ |
| | Y(P,V)$O_4$:Eu | 618 | Δ |
| | YV$O_4$:Eu | 618 | Δ |
| | CaS:Eu | 655 | ○ |
| | CaS:Eu, Tm | 650 | ◉ |
| Green | $BaMg_2Al_{16}O_{27}$:Eu, Mn | 515 | ○ |
| | $BaMgAl_{10}O_{17}$:Eu, Mn | 512 | ○ |
| | ZnS:Cu | 527 | Δ |
| | $SrAl_2O_4$:Eu | 522 | ◉ |
| | $SrAl_2O_4$:Eu, Dy | 522 | ○ |
| | ZnO:Zn | 508 | Δ |
| | $Zn_2GeO_4$:Mn | 537 | ○ |
| | $Zn_2SiO_4$:Mn | 525 | ○ |
| | $Ba_3MgSi_2O_8$:Eu, Mn | 512 | ○ |
| | $Sr_3MgSi_2O_8$:Eu, Mn | 532 | ○ |

TABLE 2

| Luminescent color | Fluorescent substance | Emission peak wavelength (nm) | Evaluation |
|---|---|---|---|
| Blue | $(Sr, Ca, Ba, Ce)_{10}(PO_4)_6Cl_2$:Eu | 457 | ◉ |
| | $BaMg_2Al_{16}O_{27}$:Eu | 455 | ◉ |
| | $BaMgAl_{10}O_{17}$:Eu | 452 | ○ |
| | ZnS:Ag | 450 | Δ |
| | $Sr_{10}(PO_4)_6Cl_2$:Eu | 447 | ○ |
| | $Ca_{10}(PO_4)_6F_2$:Sb | 480 | Δ |
| | $Sr_3MgSi_2O_8$:Eu | 462 | ○ |
| | $SrMgSi_2O_8$:Eu | 460 | Δ |
| | $SrAl_{12}O_{19}$:Eu | 400 | × |
| | $Sr_2P_2O_7$:Eu | 420 | Δ |
| | $CaAl_2O_4$:Eu, Nd | 440 | Δ |
| Blue green | $Sr_4Al_{14}O_{25}$:Eu | 492 | ◉ |
| | $Sr_4Al_{14}O_{25}$:Eu, Dy | 492 | ◉ |
| | $(Ba, Ca, Mg)_{10}(PO_4)_6Cl_2$:Eu | 482 | ○ |
| | $Sr_2Si_3O_8 \cdot 2SrCl_2$:Eu | 490 | Δ |
| Orange | ZnS:Mn | 586 | ○ |
| | ZnS:Cu, Mn, Co | 580 | ○ |

As shown in Table 1, to obtain a red luminous color with high brightness, fluorescent substances such as $La_2O_2S$: Eu, $0.5MgF_2 \cdot 3.5MgO \cdot GeO_2$: Mn, CaS: Eu, Tm are preferred. To obtain a green luminous color with high brightness, a fluorescent substance such as $SrAl_2O_4$: Eu is preferred. As shown in Table 2, to obtain a blue luminous color with high brightness, a fluorescent substance such as (Sr, Ca, Ba, Ce)$_{10}$(PO$_4$)$_6$Cl$_2$: Eu is preferred. To obtain a green luminous color with high brightness, fluorescent substances such as $Sr_4Al_{14}O_{25}$: Eu and $Sr_4Al_{14}O_{25}$: Eu, Dy are preferred.

FIGS. 2 to 7 show emission spectra and excitation spectra of main fluorescent substances used in the embodiments of the present invention. In all the graphs, the horizontal axis represents a wavelength (nm) and the vertical axis represents relative intensity (%).

The emission wavelengths of the semiconductor light-emitting element used in the present invention are in a wavelength range of from 390 to 420 nm. More optimal emission wavelength ranges vary depending on the kind or luminous color of the fluorescent substance excited in response to the emission wavelength of the semiconductor light-emitting element.

Figure 2A:
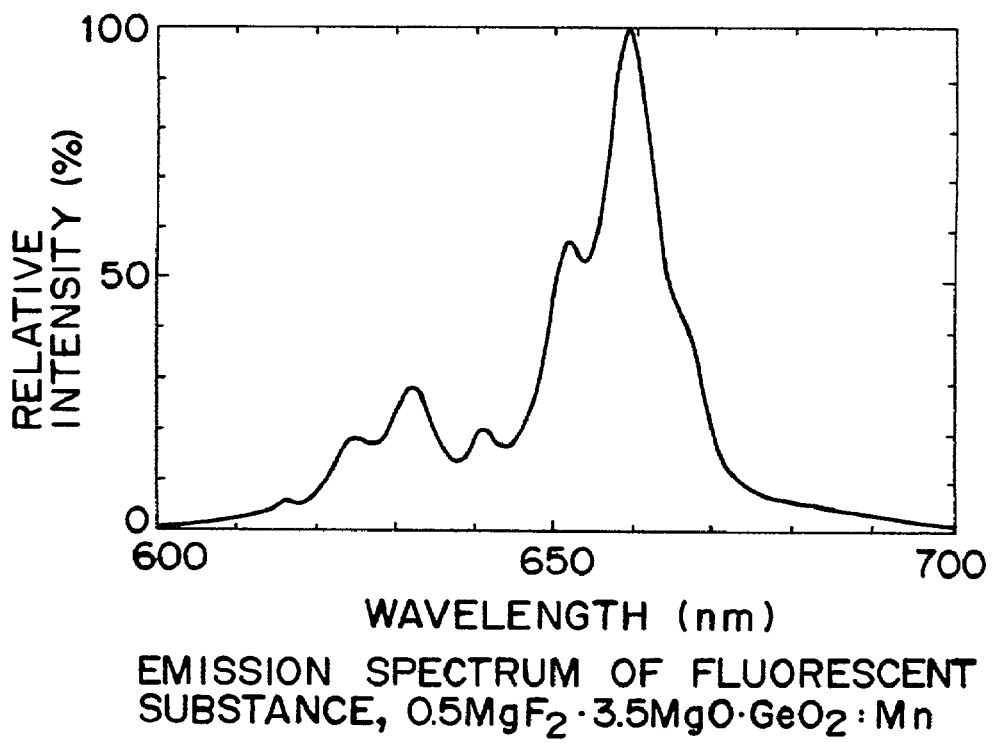
FIGS. 2A and 2B show an emission spectrum and an excitation spectrum, respectively, of a red luminous color from a fluorescent substance.
Figure 2B:
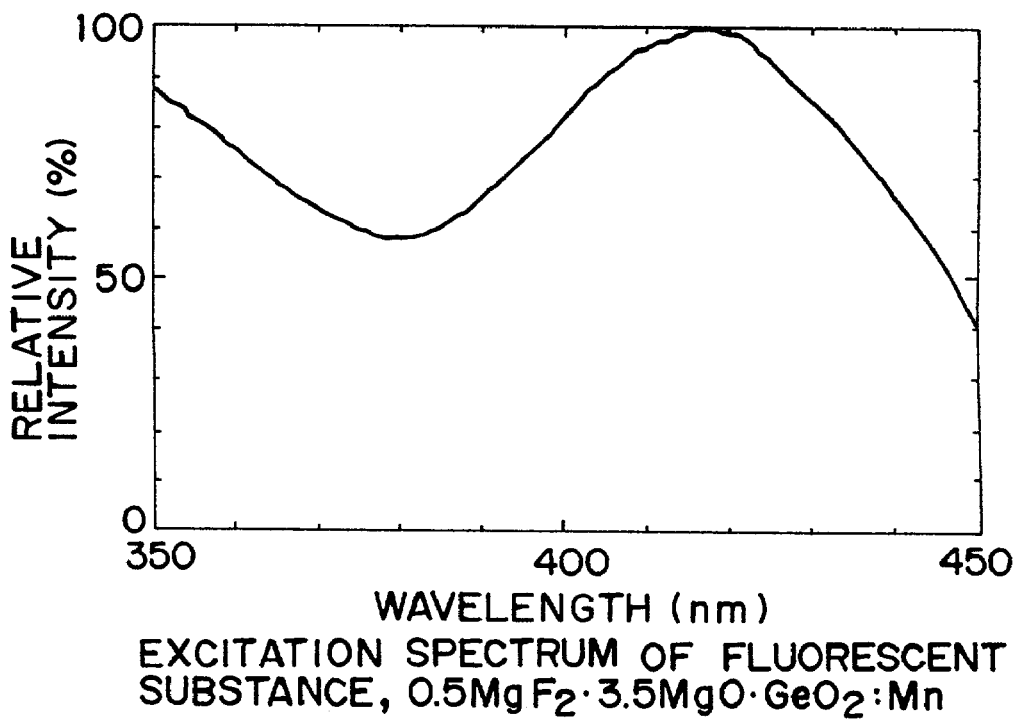

For example, when a red luminous color having an emission wavelength peak at 658 nm is obtained by the fluorescent substance $0.5MgF_2 \cdot 3.5MgO \cdot GeO_2$: Mn shown in FIG. 2A, it is effective that the fluorescent substance is excited by a semiconductor light-emitting element having an emission wavelength peak in the wavelength range of 410 to 420 nm as shown in FIG. 2B.

Figure 3A:
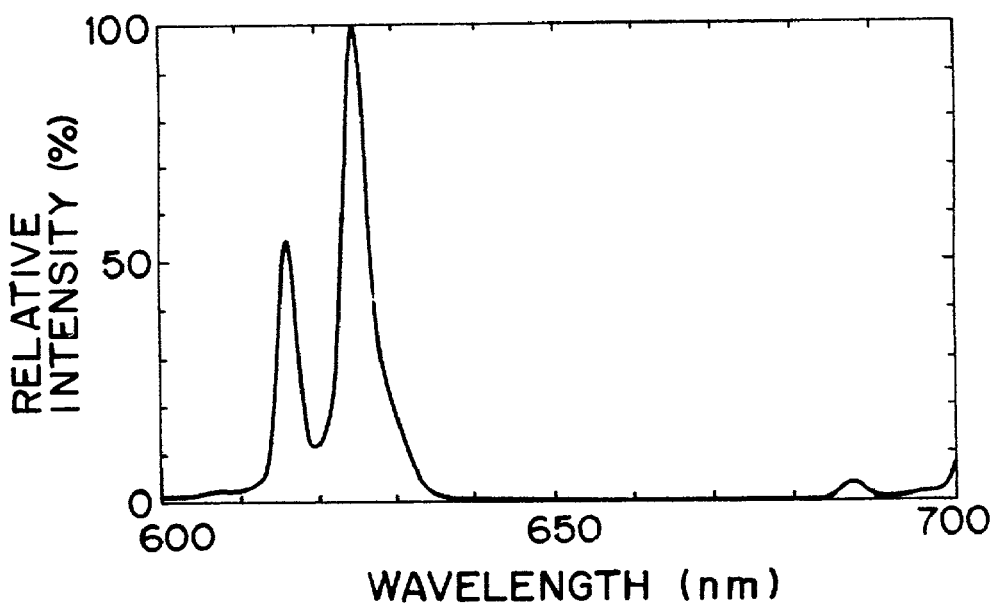
FIGS. 3A and 3B show an emission spectrum and an excitation spectrum, respectively, of a red luminous color from a fluorescent substance different from the one in FIG. 2.
Figure 3B:
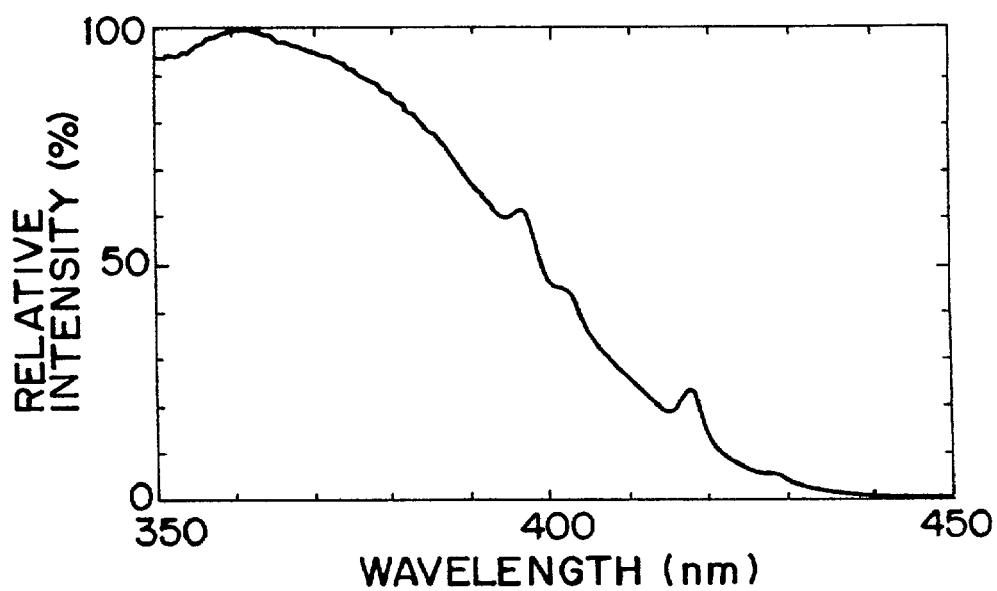

Meanwhile, when a red luminous color having an emission wavelength peak at 623 nm is obtained by the fluorescent substance $La_2O_2S$: Eu shown in FIG. 3A, it is effective that the fluorescent substance is excited by a semiconductor light-emitting element having an emission wavelength of 390 nm as shown in FIG. 3B. Originally, the exciting wavelength peak of the fluorescent substance $La_2O_2S$: Eu are closer to the short wavelength side than 390 nm. However, when the emission wavelength of the semiconductor light-emitting element exciting the fluorescent substance is shorter than 390 nm, ultraviolet rays harmful to human bodies are emitted, which is not practical. Furthermore, this light adversely affects the resin portion used in the semiconductor light-emitting device and causes lower brightness due to blackening of the sealing resin or lower reliability due to deterioration of the resin.

In addition to the above fluorescent substances, $Gd_2O_2S$: Eu, $Y_2O_2S$: Eu, $Y_2O_3$Eu, Y(P, V)$O_4$: Eu, YV$O_4$: Eu and so forth can be used in the embodiments of the present invention. Furthermore, light can be converted to red color light having an emission wavelength peak in a range of 600 to 670 nm by effectively using outgoing light from the semiconductor light-emitting element while using a plurality of these fluorescent substances.

Figure 4A:
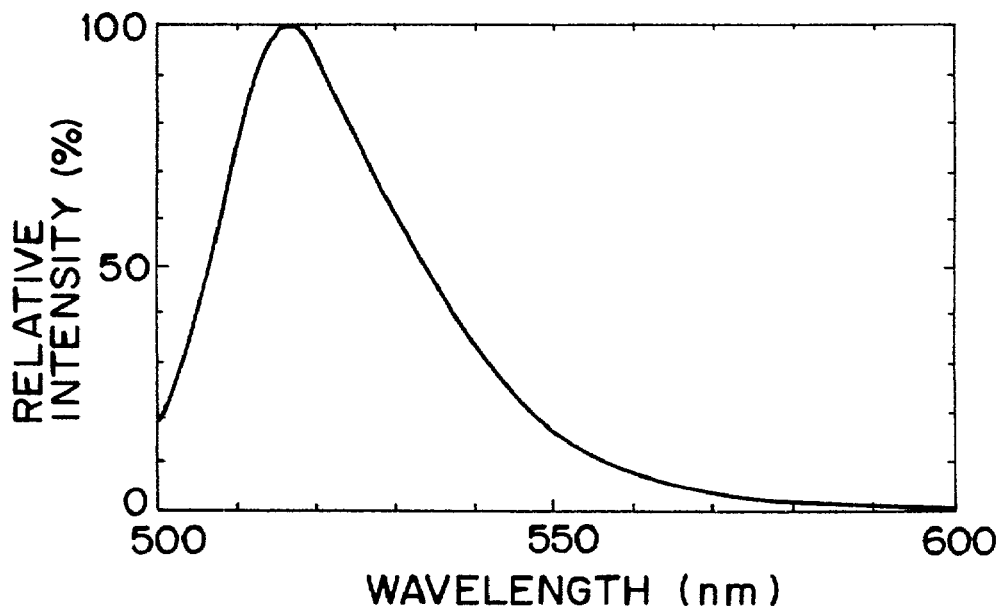
FIGS. 4A and 4B show an emission spectrum and an excitation spectrum, respectively, of a green luminous color from a fluorescent substance.
Figure 4B:
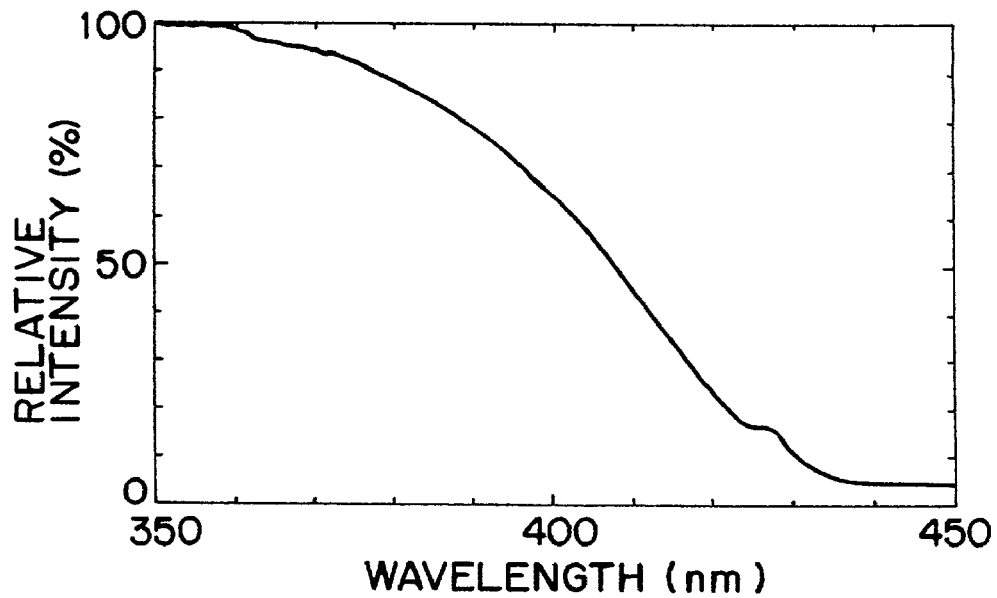

Furthermore, when a green luminous color having an emission wavelength peak at 515 nm is obtained by the fluorescent substance $BaMg_2Al_{16}O_{27}$: Eu, Mn shown in FIG. 4A, it is effective that the fluorescent substance is excited by a semiconductor light-emitting element having an emission wavelength of 390 nm as shown in FIG. 4B.

Figure 5A:
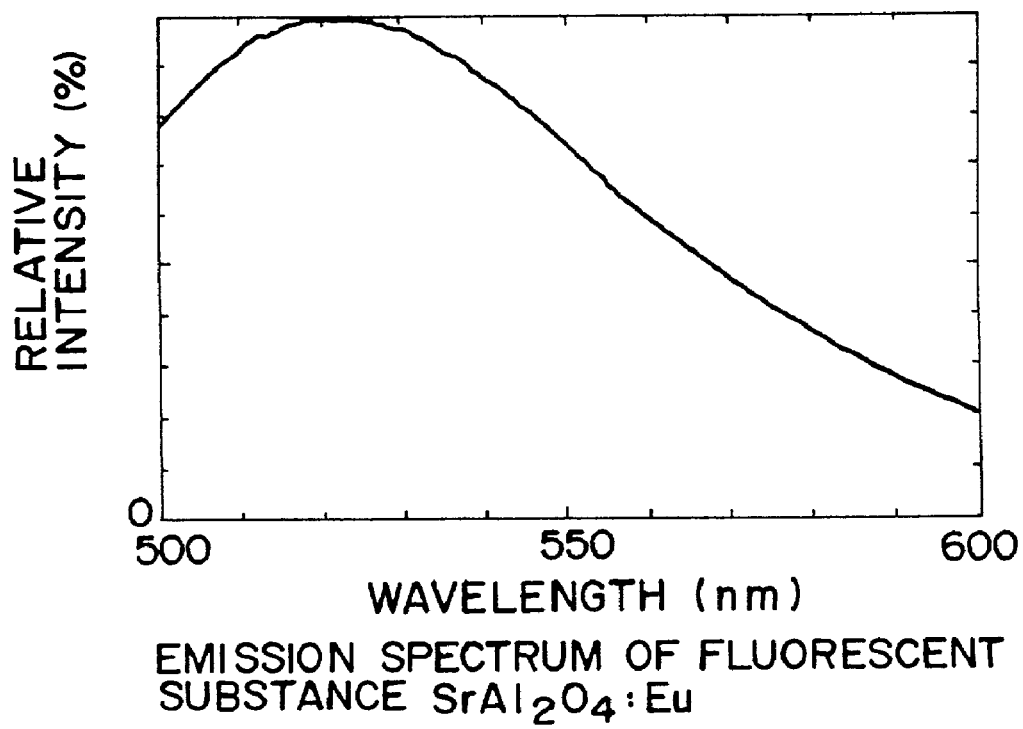
FIGS. 5A and 5B show an emission spectrum and an excitation spectrum, respectively, of a green luminous color from a fluorescent substance different from the one in FIG. 4.
Figure 5B:
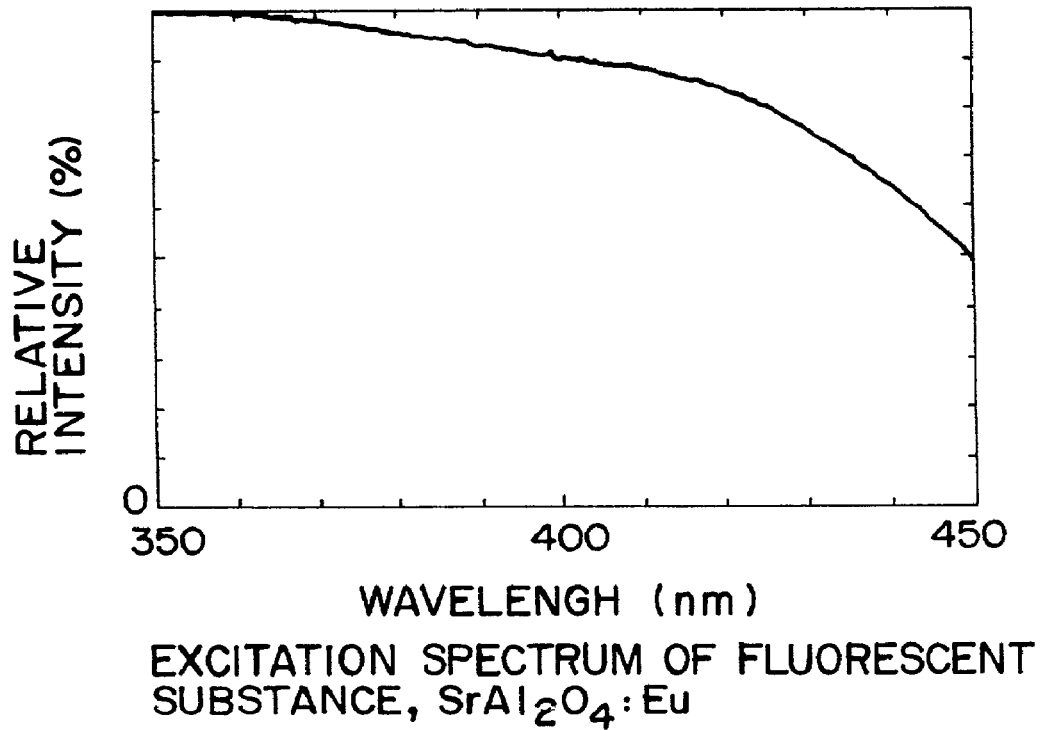

Meanwhile, when a green luminous color having an emission wavelength peak at 522 nm is obtained by the fluorescent substance $SrAl_2O_4$: Eu shown in FIG. 5A, it is effective that the fluorescent substance is excited by a semiconductor light-emitting element having an emission wavelength peak in a wavelength range of 390 to 420 nm as shown in FIG. 5B.

Originally, the exciting wavelength peaks of the fluorescent substances $BaMg_2Al_{16}O_{27}$: Eu, Mn and $SrAl_2O_4$: Eu are closer to the short wavelength side than 390 nm. However, when the emission wavelength of the semiconductor light-emitting element exciting the fluorescent substance is shorter than 390 nm, ultraviolet rays harmful to a human body are emitted, which is not practical. Furthermore, this light adversely affects the resin portion used in the semiconductor light-emitting device and causes lower brightness due to blackening of the sealing resin or lower reliability due to deterioration of the resin.

In addition to the above fluorescent substances, ZnS: Cu, $SrAl_2O_4$: Eu, Dy, ZnO: Zn, $Zn_2GeO_4$: Mn, $Zn_2SiO_4$: Mn, $Ba_3MgSi_2O_8$: Eu, Mn, $Sr_3MgSi_2O_8$: Eu, Mn and so forth can be used in the embodiments of the present invention. Furthermore, light can be converted to green color light having an emission wavelength peak in a range of 500 to 540 nm by effectively using outgoing light from the semiconductor light-emitting element while using a plurality of these fluorescent substances.

Figure 6A:
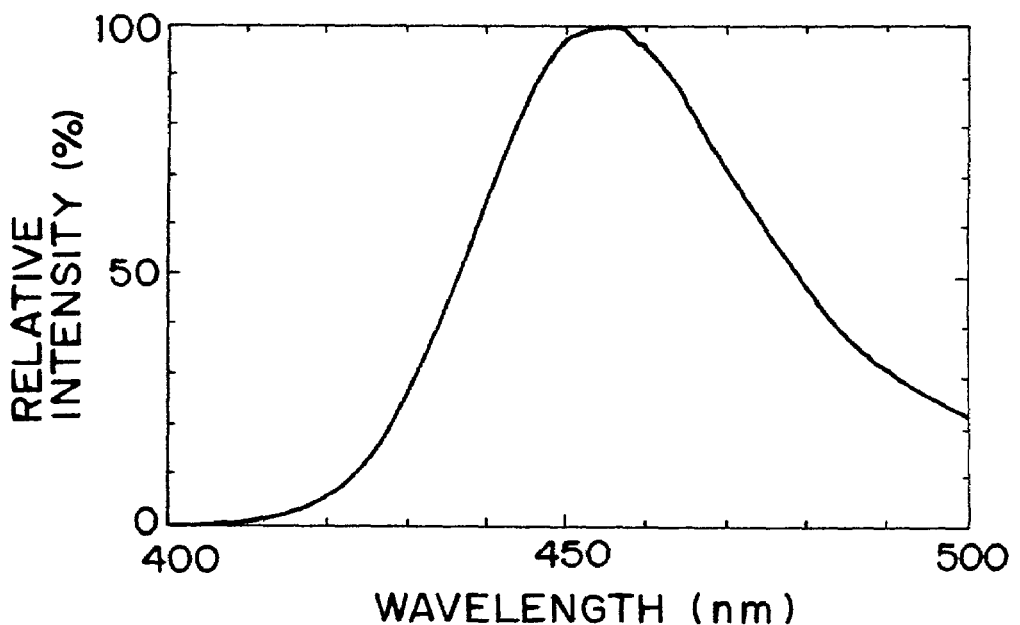
FIGS. 6A and 6B show an emission spectrum and an excitation spectrum, respectively, of a blue luminous color from a fluorescent substance.
Figure 6B:
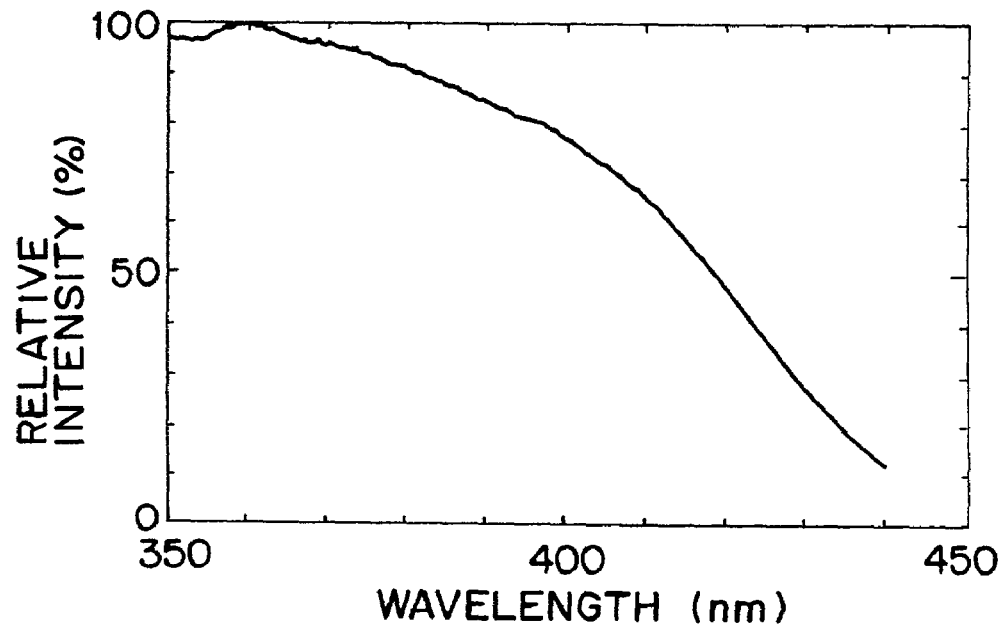

Furthermore, when a blue luminous color having an emission wavelength peak at 457 nm is obtained by the fluorescent substance (Sr, Ca, Ba, Ce)$_{10}$(PO$_4$)$_6$Cl$_2$: Eu shown in FIG. 6A, it is effective that the fluorescent substance is excited by a semiconductor light-emitting element having an emission wavelength peak in a wavelength range of 390 to 400 nm as shown in FIG. 6B. Originally, the exciting wavelength peak of the fluorescent substance (Sr, Ca, Ba, Ce)$_{10}$(PO$_4$)$_6$Cl$_2$: Eu is closer to the short wavelength side than 390 nm. However, when the emission wavelength of the semiconductor light-emitting element exciting the fluorescent substance is shorter than 390 nm, ultraviolet rays harmful to a human body are emitted, which is not practical. Furthermore, this light adversely affects the resin portion used in the semiconductor light-emitting device and causes lower brightness due to blackening of the sealing resin or lower reliability due to deterioration of the resin.

Figure 7A:
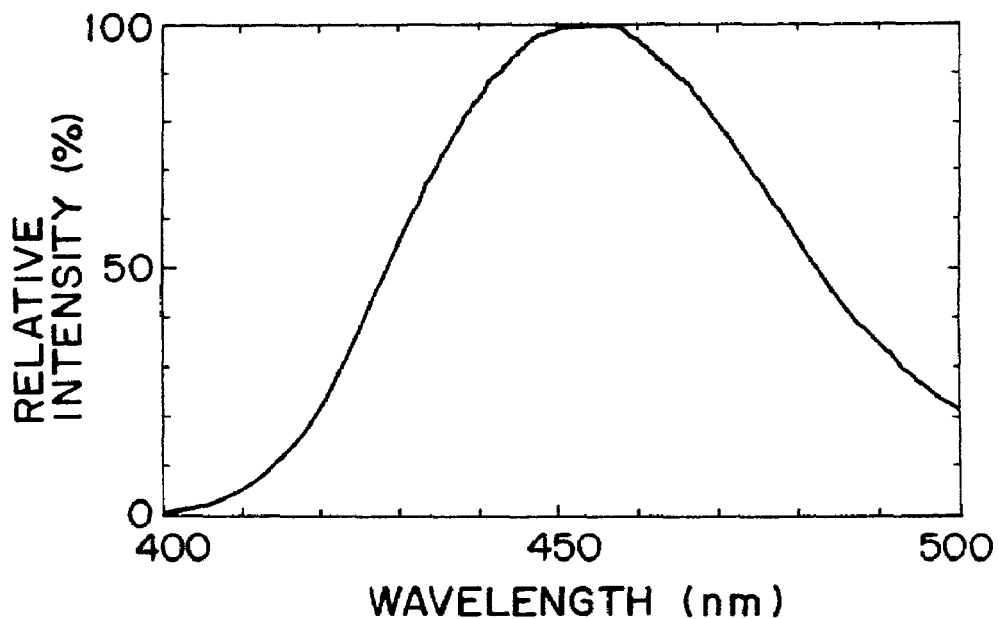
FIGS. 7A and 7B show an emission spectrum and an excitation spectrum, respectively, of a blue luminous color from a fluorescent substance different from the one in FIG. 6.
Figure 7B:
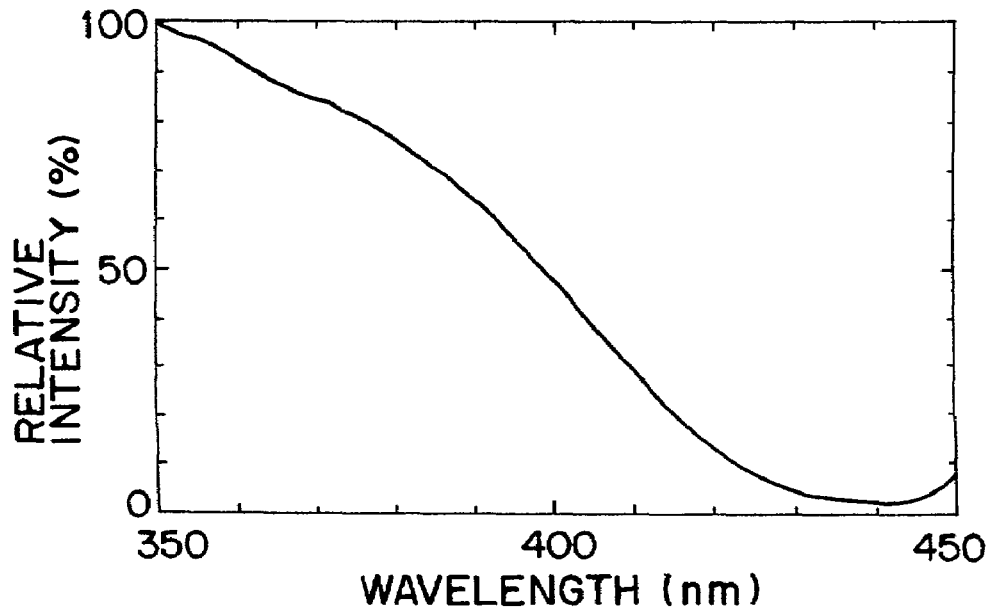

Meanwhile, when a blue luminous color having an emission wavelength peak at 452 nm is obtained by the fluorescent substance BaMgAl$_{10}$O$_{17}$: Eu shown in FIG. 7A, it is effective that the fluorescent substance is excited by a semiconductor light-emitting element having an emission wavelength of 390 nm as shown in FIG. 7B. Originally, the exciting wavelength peak of the fluorescent substance BaMgAl$_{10}$O$_{17}$: Eu is at 390 nm. However, when the emission wavelength of the semiconductor light-emitting element exciting the fluorescent substance is shorter than 390 nm, ultraviolet rays harmful to a human body are emitted, which is not practical. Furthermore, this light adversely affects the resin portion used in the semiconductor light-emitting device and causes lower brightness due to blackening of the sealing resin or lower reliability due to deterioration of the resin.

In addition to the above fluorescent substance, BaMg$_2$Al$_{16}$O$_{27}$: Eu, ZnS: Ag, Sr$_{10}$(PO$_4$)$_6$Cl$_2$: Eu, Ca$_{10}$(PO$_4$)$_6$F$_2$: Sb, Sr$_3$MgSi$_2$O$_8$: Eu, SrMgSi$_2$O$_8$: Eu, Sr$_2$P$_2$O$_7$: Eu, CaAl$_2$O$_4$: Eu, Nd and so forth can be used in the embodiments of the present invention. Furthermore, outgoing light from the semiconductor light-emitting element can be effectively converted to blue color light having an emission wavelength peak in a range of 410 to 480 nm by using a plurality of these fluorescent substances.

Furthermore, depending on the use purpose, outgoing light from the semiconductor light-emitting element can be effectively converted to blue green light having an emission wavelength peak in a range of 480 to 500 nm by using any one or more of fluorescent substances selected from Sr$_4$Al$_{14}$O$_{25}$: Eu, Sr$_4$Al$_{14}$O$_{25}$: Eu, Dy, (Ba, Ca, Mg)$_{10}$(PO$_4$)$_6$Cl$_2$: Eu, Sr$_2$Si$_3$O$_8$.2SrCl$_2$: Eu and so forth.

Furthermore, outgoing light from the semiconductor light-emitting element can be converted to orange light having an emission wavelength peak in a range of 570 to 600nm by using ZnS: Mn, ZnS: Cu or Mn, Co as the fluorescent substances.

Hereafter, the semiconductor light-emitting devices according to the embodiments of the present invention are described in detail with reference to the accompanying drawings.

First Embodiment

FIGS. 8A to 8C are cross sectional views showing a semiconductor light-emitting device according to a first embodiment of the invention.

FIG. 8A is a cross sectional view showing a lamp-type semiconductor light-emitting device including a semiconductor light-emitting element 7a having an insulating substrate as shown in FIG. 1A, wherein the semiconductor light-emitting element 7a is sealed with a mold resin as a lamp-shaped sealing resin containing a dispersed fluorescent substance.

This semiconductor light-emitting device has a cup-shaped recessed mount section 10a at an end of a lead frame 101 as a base substance. The semiconductor light-emitting element 7a is fixed on this cup-shaped mount section 10a with an adhesive agent 11 composed of, for example, an epoxy resin or the like. A P-side electrode 6a formed on the upper surface of the semiconductor light-emitting element 7a is connected to an electrode section 10b of the lead frame 101 with a metallic wire 6p composed of, for example, Au, Al, Cu or the like. Furthermore, an N-side electrode 5a formed on the upper surface of the semiconductor light-emitting element 7a is connected to an electrode section 10c of a right-side lead frame 102 with a metallic wire 5n. The semiconductor light-emitting element 7a and upper portions of the lead frames 101, 102 are sealed with a mold resin 130 such as, for example, a transmissive epoxy resin or the like containing a dispersed fluorescent substance to form a lamp-shaped semiconductor light-emitting device. The adhesive agent 11 for bonding the semiconductor light-emitting element 7a and the mount section 10a of the lead frame 101 is not particularly limited so long as its material does not absorb light from the semiconductor light-emitting element 7a. For example, a resin material mixed with a metallic material having favorable heat conductivity to improve a heat characteristic of the semiconductor light-emitting element 7a may be used. Also, a resin material containing a material efficiently reflecting and scattering light from the semiconductor light-emitting element 7a towards the mount section 10a of the lead frame 101 or the like may be used.

FIG. 8B is a cross sectional view showing a lamp-type semiconductor light-emitting device including a semiconductor light-emitting element 7b having a conductive substrate as shown in FIG. 1B, wherein the semiconductor light-emitting element 7b is sealed with a mold resin 130 as a lamp-shaped sealing resin containing a dispersed fluorescent substance.

In this figure, component members having the same functions as in the semiconductor light-emitting device shown in FIG. 8A are designated by the same reference numerals and their detailed explanations are omitted.

In this semiconductor light-emitting device, an N-side electrode section 5b of the semiconductor light-emitting element 7b is directly connected to a mount section 10a of a lead frame 101 with, for example, a conductive solder composed of a metal such as indium or the like or an adhesive agent 15 composed of an Au-epoxy resin, an Ag-epoxy resin or the like. Meanwhile, a P-side electrode 6b formed on the upper surface of the semiconductor light-emitting element 7b is connected to an electrode section 10c of a right-side lead frame 102 in FIG. 8B with a metallic wire 6p. The semiconductor light-emitting element 7b and upper portions of the lead frames 101, 102 are sealed with a mold resin 130 containing a dispersed fluorescent substance to form a lamp-shaped semiconductor light-emitting device. Since the electrodes 6b, 5b formed on the upper and lower surfaces of the semiconductor light-emitting element 7b are similar to a conventional GaAs or GaP semiconductor light-emitting element, a lead frame used in a conventional semiconductor light-emitting device can be utilized as it is.

FIG. 8C is a cross sectional view showing a lamp-type semiconductor light-emitting device including a semiconductor light-emitting element 7c having an insulating substrate as shown in FIG. 1C, wherein the semiconductor light-emitting element 7c and lead frames 103, 103 are connected without using a metallic wire and the semiconductor light-emitting element 7c is sealed with a mold resin 130 as a lamp-shaped sealing resin containing a dispersed fluorescent substances In this semiconductor light-emitting device, a submount 17 as a base substance is connected to ends of lead frames 103, 103, which are opposed to each other. This submount 17 is composed of Si and has insulating property. Electrode interconnection wires 17a, 17b are formed on the upper surface of the submount 17. The semiconductor light-emitting element 7c is mounted on the upper surface of the submount 17 with a semiconductor layer surface (a lower surface of the semiconductor light-emitting element 7c in FIG. 1C) facing the submount 17. A P-side electrode 6c and an N-side electrode 5c formed on the lower surface of the semiconductor light-emitting element 7c are connected to the electrode interconnection wires 17a, 17b formed on the upper surface of the submount 17 by using Au bumps or the like. The electrode interconnection wires 17a, 17b formed on the upper surface of the submount 17 are connected to end portions 10d, 10e of the lead frames so as to be electrically connected to the outside. Furthermore, the semiconductor light-emitting element 7c, the submount 17 and upper portions of the lead frames 103, 103 are sealed with a mold resin 130 composed of an epoxy resin containing a dispersed fluorescent substance to form a lamp-shaped semiconductor light-emitting device. Since the semiconductor light-emitting element 7c is directly connected to the submount 17 in this semiconductor light-emitting device, heat from a light-emitting region of the semiconductor light-emitting element 7c can be rapidly released to the outside of the semiconductor light-emitting device via the submount 17 and the lead frames 103, 103.

The lamp-shaped semiconductor light-emitting devices shown in FIGS. 8A, 8B and 8C emit light having a directivity upwards in FIGS. 8A, B and C. In particular, in the semiconductor light-emitting devices shown in FIGS. 8A and 8B, the mount section 10a of the lead frame 101 is formed in a cup shape to efficiently collect light emitted from the semiconductor light-emitting element 7a, 7b. In addition to an epoxy resin, transmissive thermosetting or thermoplastic resins such as a silicon resin, a urethane resin and a polycarbonate resin may be used as the mold resin 130. Furthermore, the fluorescent substance may be uniformly dispersed in the whole mold resin 130, but when the fluorescent substance content rate is gradually increased from the surface of the mold resin 130 towards the semiconductor light-emitting element 7a, 7b, 7c, deterioration of the fluorescent substance due to influences from the outside of the mold resin 130, such as moisture, can be reduced. Furthermore, when the fluorescent substance content rate is gradually increased from the semiconductor light-emitting element 7a, 7b, 7c towards the surface of the mold resin 130, electrical and thermal effects of semiconductor light-emitting element 7a, 7b, 7c on the fluorescent substance can be relieved. Thus, the distribution of the fluorescent substance in the mold resin 130 can vary depending on the kind of the mold resin, the kind of the fluorescent substance, use environment, conditions, purposes and so forth.

Second Embodiment

Figure 9A:
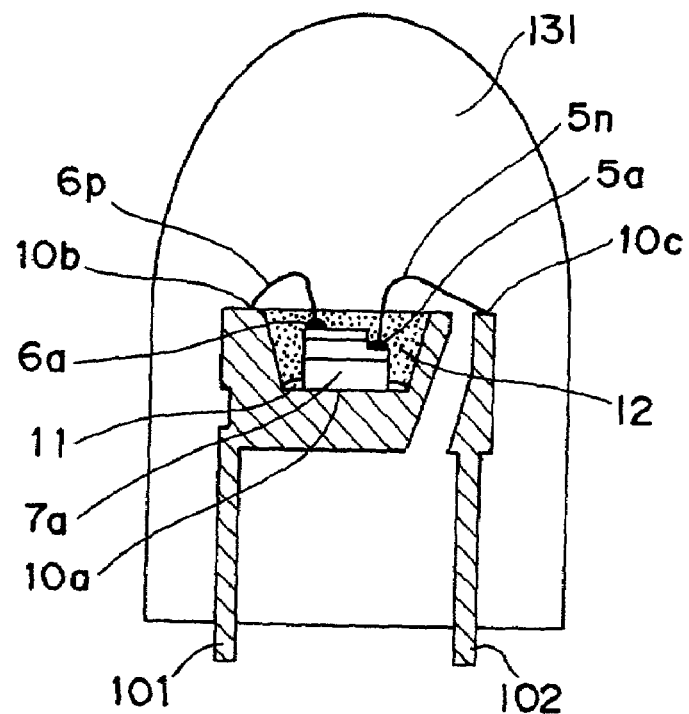
FIGS. 9A and 9B are cross sectional views showing a semiconductor light-emitting device according to a second embodiment of the invention.
Figure 9B:
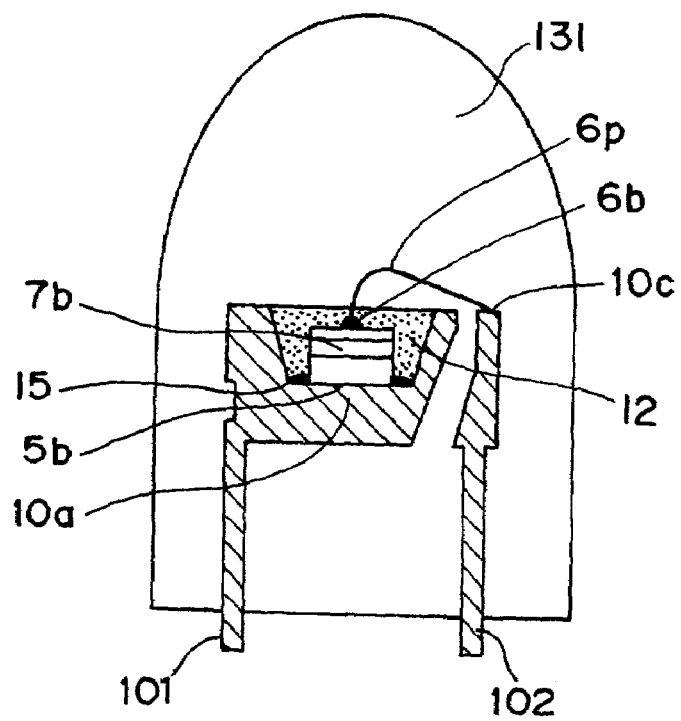

FIGS. 9A and 9B are cross sectional views showing a semiconductor light-emitting device according to a second embodiment of the invention. The semiconductor light-emitting device shown in FIG. 9A is the same as the semiconductor light-emitting device shown in FIG. 8A except that a fluorescent substance is filled in the mount section 10a of the lead frame 101 and that the mold resin 131 does not contain the fluorescent substance. The semiconductor light-emitting device shown in FIG. 9B is also the same as the semiconductor light-emitting device shown in FIG. 8B except that a fluorescent substance is filled in the mount section 10a of the lead frame 101 and that the mold resin 131 does not contain the fluorescent substance. Therefore, component members having the same functions as in the semiconductor light-emitting devices shown in FIGS. 8A and 8B are designated by the same reference numerals and their detailed explanations are omitted. This is applicable to the subsequent other embodiments.

In the semiconductor light-emitting device shown in FIGS. 9A and 9B, the semiconductor light-emitting element 7a, 7b is disposed at the bottom of a cup-shaped mount section 10a and a fluorescent substance 12 is filled in this mount section 10a so that the wavelength of light from the semiconductor light-emitting element 7a, 7b can be converted by this fluorescent substance 12. That is, the fluorescent substance 12 is disposed in the mount section 10a for collecting light from the semiconductor light-emitting element 7a, 7b so that all the light from the semiconductor light-emitting element 7a, 7b is converted without exception, thereby enhancing the light conversion efficiency. Therefore, color tones of the semiconductor light-emitting device are favorable as compared with a case where the fluorescent substance is dispersed in the whole mold resin as in the first embodiment. Furthermore, since the fluorescent substance needs to be disposed only in the mount section 10a, the amount of the used fluorescent substance can be reduced.

In the above embodiment, the fluorescent substance 12 was filled in the whole mount section 10a of the lead frame 101. However, so long as light emitted from the semiconductor light-emitting element 7a, 7b can be sufficiently converted to light having predetermined wavelengths, the fluorescent substance 12 does not necessarily need to be filled in the whole mount section 10a, but can be filled in a recessed shape in the mount section 10a. Alternatively, the fluorescent substance 12 may be filled so as to be swollen in a projected shape from the upper end of the mount section 10a. That is, the fluorescent substance 12 only needs to be filled in the mount section 10a in an amount in which the wavelength of light from the semiconductor light-emitting element 7a, 7b can be converted to a desired wavelength.

Third Embodiment

Figure 10A:
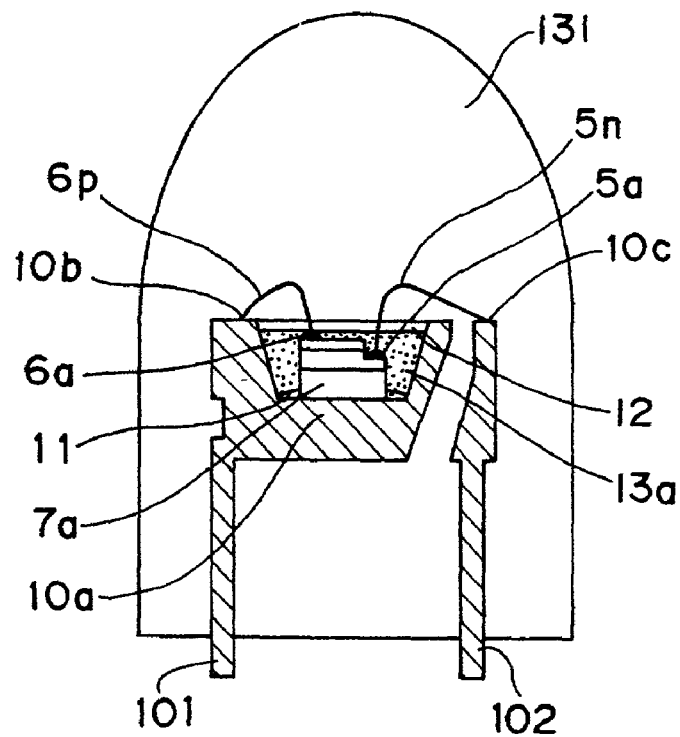
FIGS. 10A and 10B are cross sectional views showing a semiconductor light-emitting device according to a third embodiment of the invention.
Figure 10B:
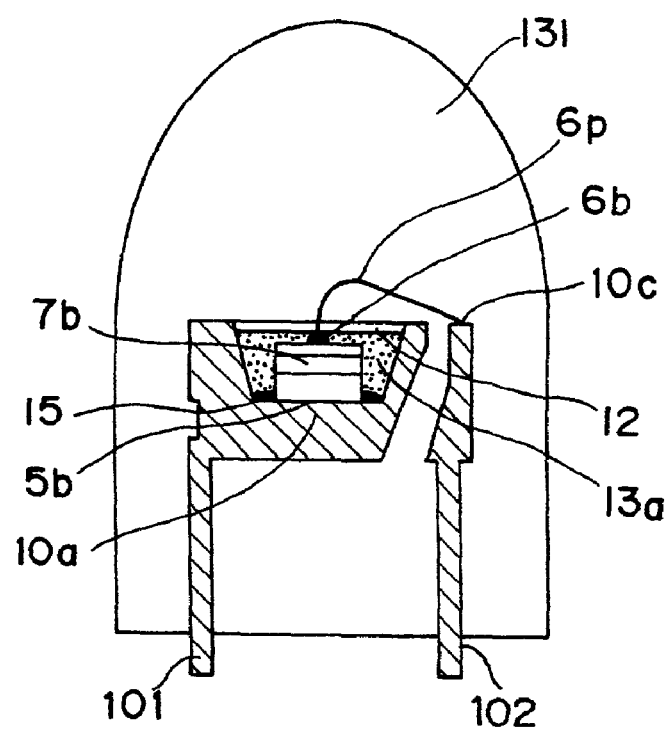

FIGS. 10A and 10B are cross sectional views showing a semiconductor light-emitting device according to a third embodiment of the invention. The semiconductor light-emitting device shown in FIG. 10A is the same as the semiconductor light-emitting device shown in FIG. 9A except that a precoating 13a is disposed so as to cover the whole semiconductor light-emitting element 7a in the mount section 10a of the lead frame 101 and that the fluorescent substance 12 is disposed thereon. The semiconductor light-emitting device shown in FIG. 10B is the same as the semiconductor light-emitting device shown in FIG. 9B except that a precoating 13a is disposed so as to cover the whole semiconductor light-emitting element 7a in the mount section 10a of the lead frame 101 and that the fluorescent substance 12 is disposed thereon. Therefore, component members having the same functions as in the semiconductor light-emitting devices shown in FIGS. 9A and 9B are designated by the same reference numerals and their detailed explanations are omitted.

In FIGS. 10A and 10B, a semiconductor light-emitting element 7a, 7b is disposed at the bottom of a cup-shaped mount section 10a formed at an end of a left-side lead frame 101. A precoating 13a composed of, for example, an epoxy resin, a silicon resin or a urethane resin is formed so as to cover the whole semiconductor light-emitting element 7a, 7b. A fluorescent substance 12 is disposed on this precoating 13a in a layer so as to fill the inside of the mount section 10a. The fluorescent substance 12 is formed on the precoating 13a by dipping the mount section 10a, in which the precoating 13a is formed, or potting, spraying or vapor depositing the substance on the precoating 13a in the mount section 10a. In FIGS. 10A and 10B, the fluorescent substance 12 is formed only inside the mount section 10a of the lead frame 101, but may be formed so as to cover the whole upper surface of the lead frame 101.

In the semiconductor light-emitting devices shown in FIGS. 10A and 10B, the fluorescent substance 12 is formed in a uniform thickness with substantially equal distances from the light-emitting region of the semiconductor light-emitting element 7a, 7b by the precoating 13a. Therefore, since the quantity of light that passes through the fluorescent substance 12 is substantially equal in all the regions, this semiconductor light-emitting device can obtain uniform emission light without unevenness. Furthermore, since the fluorescent substance 12 is disposed at a position distant from the semiconductor light-emitting element 7a, 7b, electrical and thermal effects of the semiconductor light-emitting element on the fluorescent substance 12 can be relieved. As a result, a semiconductor light-emitting device having a favorable light emitting characteristic and durability can be obtained.

Fourth Embodiment

Figure 11A:
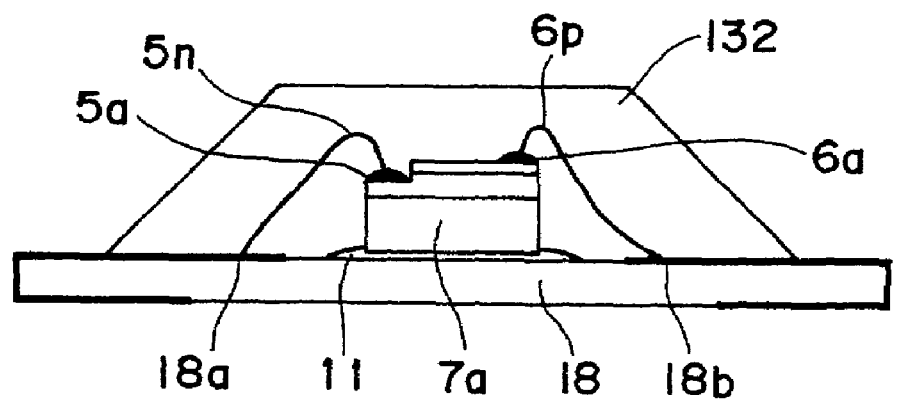
FIGS. 11A and 11B are cross sectional views showing a semiconductor light-emitting device according to a fourth embodiment of the invention.
Figure 11B:
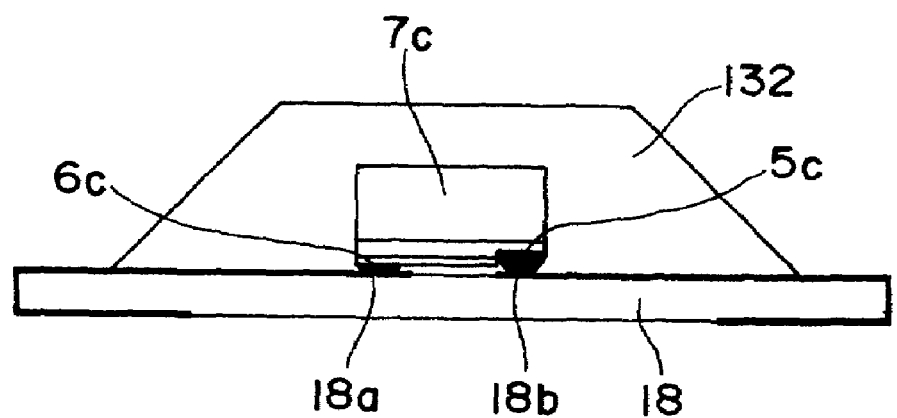

FIGS. 11A and 11B are cross sectional views showing a semiconductor light-emitting device according to a fourth embodiment of the invention.

In FIG. 11A, a semiconductor light-emitting element 7a having an insulating substrate is mounted on a printed circuit board 18 as a base substance and the semiconductor light-emitting element 7a is sealed with a mold resin 132 as a sealing resin containing a fluorescent substance dispersed.

In this semiconductor light-emitting device, a semiconductor light-emitting element 7a is bonded on a rectangular-solid-shaped printed circuit board 18 composed of a glass epoxy, which has heat resistance, with an adhesive agent 11 composed of an epoxy resin. A P-side electrode 6a and an N-side electrode 5a formed on the upper surface of this semiconductor light-emitting element 7a are connected to electrode sections 18a, 18b, respectively, on the upper surface of the printed circuit board 18 with metallic wires 6p, 5n. These electrode sections 18a, 18b are led to the lower surface of the printed circuit board 18 as a mounting surface via through holes (not shown) with a circular-arc cross section for connecting the upper surface and the lower surface of the printed circuit board 18 and then extend to both ends of this mounting surface. It is noted that an insulating film may be used as the printed circuit board 18.

Subsequently, a mold resin 132 such as, for example, a transmissive epoxy resin or the like as a sealing resin containing dispersed fluorescent substance is formed on the printed circuit board 18 so as to cover the whole semiconductor light-emitting element 7a while having a trapezoidal cross section as shown in FIG. 11A. Thus, a semiconductor light-emitting device in a chip component shape is formed.

The adhesive agent 11 for bonding the semiconductor light-emitting element 7a and the printed circuit board 18 is not limited so long as its material does not absorb light from the semiconductor light-emitting element 7a. For example, a resin material mixed with a metallic material having favorable heat conductivity to improve a heat characteristic of the semiconductor light-emitting element 7a, a resin material containing a material for efficiently reflecting and scattering light from the semiconductor light-emitting element 7a towards the printed circuit board 18 or the like may used. However, when a resin material containing a metallic material is used, an attention is required not to short-circuit the P-side electrode 6a and the N-side electrode 5a.

FIG. 11B is the same as the semiconductor light-emitting device shown in FIG. 11A except that the semiconductor light-emitting element 7c having an insulating substrate is included instead of the semiconductor light-emitting element 7a in FIG. 11A. Therefore, component members having the same functions as in the semiconductor light-emitting device shown in FIG. 11A are designated by the same reference numerals and their detailed explanations are omitted.

In the semiconductor light-emitting device in FIG. 11B, a semiconductor light-emitting element 7c emits light through an insulating substrate disposed on the upper side of the semiconductor light-emitting element 7c in FIG. 11B. In the semiconductor light-emitting element 7c, a P-side electrode 6c and an N-side electrode 5c formed on a semiconductor laminated side, which is the lower side in FIG. 11B, are directly connected to electrode sections 18a and 18b, respectively, on the printed circuit board 18 via Au bumps. The semiconductor light-emitting element 7c may be mounted on a submount composed of Si or the like on which metallic wiring is provided in advance and the submount may be electrically connected to the printed circuit board 18 by die bonding, wire bonding or the like. Since the semiconductor light-emitting element 7c is mounted with the semiconductor-laminated surface facing the printed circuit board 18 in this semiconductor light-emitting device, heat can be rapidly released from a light-emitting region of the semiconductor light-emitting element 7c to the outside.

In addition to an epoxy resin, transmissive thermosetting or thermoplastic resins such as, for example, a silicon resin, a urethane resin, a polycarbonate resin and so forth may be used as the mold resin 132 of the semiconductor light-emitting devices in FIGS. 11A and 11B. Furthermore, the fluorescent substance may be uniformly disposed in the whole mold resin 132, but, when the fluorescent substance content rate is gradually increased from the surface of the mold resin 132 towards the semiconductor light-emitting element, deterioration of the fluorescent substance due to influences such as moisture can be reduced. Furthermore, when the fluorescent substance content rate is gradually increased from the semiconductor light-emitting element 7a, 7c towards the surface of the mold resin 132, electrical and thermal effects of the semiconductor light-emitting element 7a, 7c on the fluorescent substance can be relieved. Thus, the distribution of the fluorescent substance in the mold resin 132 can vary depending on the kind of the mold resin, the kind of the fluorescent substance, use environment, conditions, purposes and so forth.

Instead of the semiconductor light-emitting element 7a, 7c, a semiconductor light-emitting element 7b having a conductive substrate may be used. In this case, one electrode on the printed circuit board 18 is directly connected to the N-type electrode formed on the lower surface of the semiconductor light-emitting element 7b with an adhesive agent having conductivity. The P-side electrode formed on the upper surface of the semiconductor light-emitting element 7b is connected to the other electrode section on the printed circuit board 18 with a metallic wire. Since the semiconductor light-emitting element 7b has electrodes on both the upper and lower surfaces of the semiconductor light-emitting element 7b as in the case of a conventional GaAs or GaP semiconductor light-emitting device, a conventional lead frame can be utilized as it is.

Fifth Embodiment

Figure 12A:
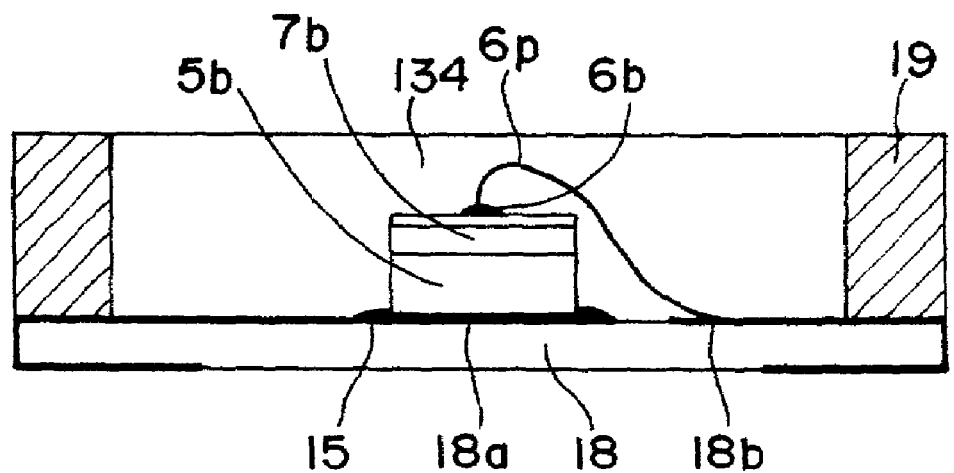
FIGS. 12A and 12B are cross sectional views showing a semiconductor light-emitting device according to a fifth embodiment of the invention.
Figure 12B:
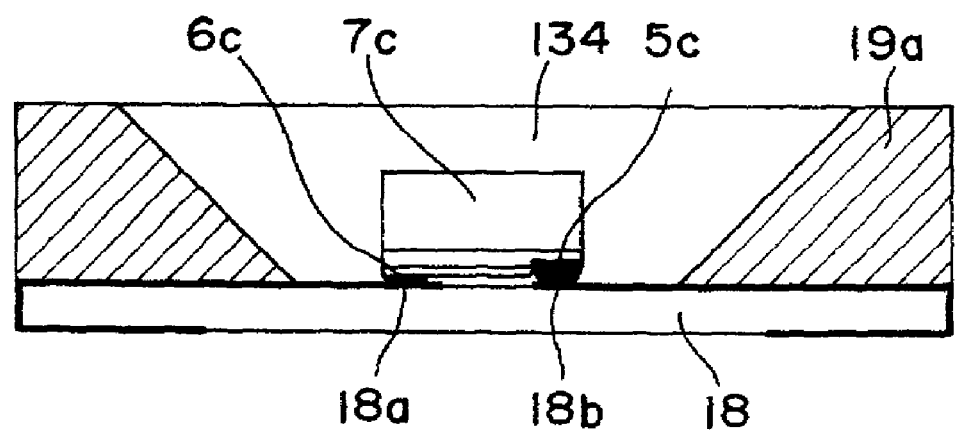

FIGS. 12A and 12B are cross sectional views showing a semiconductor light-emitting device according to a fifth embodiment of the invention. The semiconductor light-emitting device shown in FIG. 12A has a frame 19 composed of a resin on a printed circuit board 18 as a base substance. A semiconductor light-emitting element 7b having a conductive substrate is disposed inside the resin frame 19 on the printed circuit board 18. A mold resin 134 as a sealing resin containing a fluorescent substance is filled in the resin frame 19 to seal the semiconductor light-emitting element 7b.

In this semiconductor light-emitting device, a frame 19 composed of a resin is formed on a rectangular-solid-shaped printed circuit board 18 composed of a glass epoxy, which has heat resistance. This resin frame 19 has a height enough for the mold resin 134 filled therein to fully cover the semiconductor light-emitting element 7b. In the frame 19, one electrode section 18a on the printed circuit board 18 is connected to an N-side electrode 5b on the lower surface of the semiconductor light-emitting element 7b by bonding with an adhesive agent having conductivity. Meanwhile, a P-side electrode 6b formed on the upper surface of the semiconductor light-emitting element 7b is connected to the other electrode section 18b on the printed circuit board 18 with a metallic wire 6p. The electrode sections 18a, 18b are led three-dimensionally from the upper surface of the printed circuit board 18 to the lower surface as a mounting surface and extend via through holes (not shown) having a circular arc cross section that penetrate through the printed circuit board 18 and then extend to both ends of the lower surface of the printed circuit board 18. The mold resin 134 composed of a transmissive epoxy resin containing a dispersed fluorescent substance is filled in the resin frame 19 on the printed circuit board 18 so as to cover the whole semiconductor light-emitting element 7b. Since the semiconductor light-emitting element 7b has electrodes 6b, 5b on both the upper and lower surfaces of the semiconductor light-emitting element 7b as in the case of a conventional GaAs or GaP semiconductor light-emitting device, a conventional lead frame can be commonly utilized as it is. It is noted that an insulating film may be used as the base substance in addition to the printed circuit board 18.

The semiconductor light-emitting device in FIG. 12B has a resin frame 19a on a printed circuit board 18 as a base substance. A semiconductor light-emitting element 7c having an insulating substrate is disposed inside the resin frame 19a, which is filled with a mold resin 134 as sealing resin containing a dispersed fluorescent substance. Side surfaces of the resin frame 19a facing the semiconductor light-emitting element 7c are inclined so that light emitted from the side surfaces of the semiconductor light-emitting element 7c is reflected in the direction perpendicular to the printed circuit board 18.

This semiconductor light-emitting device has a resin frame 19a having inclined side surfaces facing a semiconductor light-emitting element 7c on a rectangular-solid-shaped printed circuit board 18 composed of a glass epoxy. The semiconductor light-emitting element 7c is mounted on the printed circuit board 18 with the semiconductor-laminated surface facing downwards. A P-side electrode 6c and an N-side electrode 5c of the semiconductor light-emitting element 7c are connected to electrode sections 18a and 18b, respectively, on the printed circuit board 18 via Au bumps. As in the case of the semiconductor light-emitting device shown in FIG. 12A, the electrode sections 18a, 18b are led three-dimensionally from the upper surface of the printed circuit board 18 to the lower surface as a mounting surface via through holes (not shown) and then extend to both ends of the lower surface of the printed circuit board 18. It is noted that an insulating film may be used as the base substance in addition to the printed circuit board 18. The semiconductor light-emitting element 7c is directly connected to the printed circuit board 18, but the semiconductor light-emitting element 7c may be mounted on a submount composed of Si, on which metallic wiring is provided in advance, and the submount may be electrically connected to the printed circuit board 18 by die bonding, wire bonding or the like.

Since the semiconductor-laminated surface of the semiconductor light-emitting element 7c is directly mounted on the printed circuit board 18 in this semiconductor light-emitting device, heat from a light-emitting region of the semiconductor light-emitting element 7c can be rapidly released to the outside through the submount and the lead frames.

The mold resin 134 in the semiconductor light-emitting devices in FIGS. 12A and 12B has the same material as that of the mold resins 13 in FIG. 8A, 8B and 8C. The distribution of the fluorescent substance in the mold resin can vary depending on the kind of the mold resin, the kind of the fluorescent substance, use environment, conditions, purposes and so forth.

In FIGS. 12A and 12B, the resin frame 19, 19a is formed separately from the printed circuit board 18 and then bonded on the printed circuit board 18. However, a part of a thick printed circuit board may be removed to form a recessed portion so that the periphery of this recessed portion can be used as a frame. Furthermore, it may be constituted such that a through hole is formed in the printed circuit board 18, electrodes composed of a metal foil, which also serve as interconnection wires, are disposed on the bottom surface of this printed circuit board 18, the semiconductor light-emitting element is disposed on the electrodes/interconnection wires and the through hole portion is sealed with a sealing resin.

Furthermore, in the semiconductor light-emitting devices in FIGS. 12A and 12B, the semiconductor light-emitting element 7a shown in FIG. 1A may be used instead of the semiconductor light-emitting element 7b, 7c. When this semiconductor light-emitting element 7a is used, electrodes of the semiconductor light-emitting element 7a are connected to the electrode sections of the printed circuit board 18 with metallic wires.

Sixth Embodiment

Figure 13:
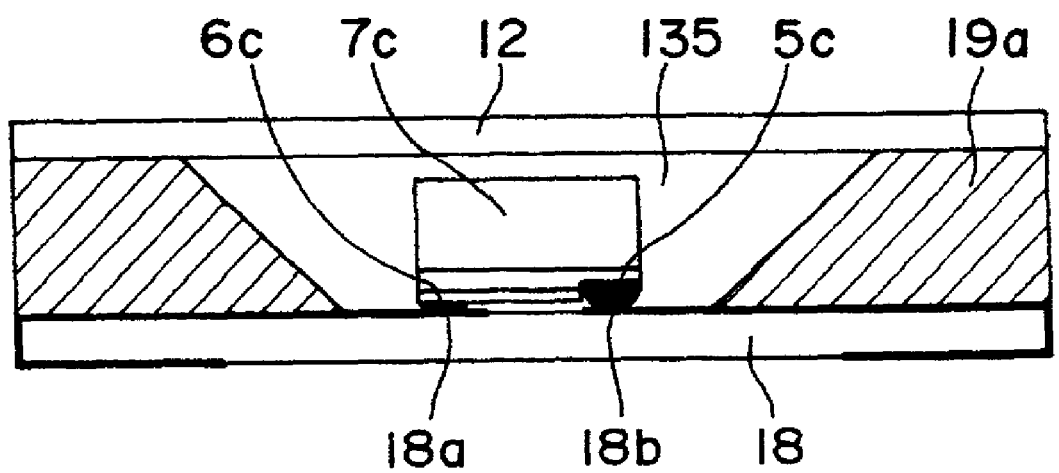
FIG. 13 is a cross sectional view showing a semiconductor light-emitting device according to a sixth embodiment of the invention.

FIG. 13 is a cross sectional view showing a semiconductor light-emitting device according to a sixth embodiment of the invention.

This semiconductor light-emitting device has the same frame 19a as the frame included in the semiconductor light-emitting device shown in FIG. 12B. This frame 19a is formed on the printed circuit board 18 composed of a glass epoxy as a rectangular-solid-shaped base substance. Side surfaces of the frame 19a facing the semiconductor light-emitting element 7c are inclined so that light from side surfaces of the semiconductor light-emitting element 7c is reflected in the direction perpendicular to the printed circuit board 18. The semiconductor light-emitting element 7c is mounted on the printed circuit board 18 with a semiconductor-laminated side facing downwards in FIG. 13 so that light is emitted from the upper substrate side in FIG. 13. Electrodes 6c, 5c of this semiconductor light-emitting element 7c are connected to the electrode sections 18a, 18b of the printed circuit board 18 via bumps as in the case of the semiconductor light-emitting device shown in FIG. 12B. A mold resin 135 as a transmissive sealing resin composed of an epoxy resin is filled in the frame 19a disposed on the printed circuit board 18 to seal the semiconductor light-emitting element 7c. A fluorescent substance 12 is formed in a layer having a predetermined layer thickness on the frame 19a and the mold resin 13.

Since the fluorescent substance 12 is formed in a uniform thickness at a position in substantially equal distances from a light-emitting region of the semiconductor light-emitting element 7c in this semiconductor light-emitting device of this embodiment, the quantity of light that passes through the fluorescent substance 12 is substantially consistent at any position of all the fluorescent substance 12 particles and thus uniform light without unevenness can be emitted. Furthermore, since the fluorescent substance 12 is formed with a predetermined distance from the semiconductor light-emitting element 7c, electrical and thermal effects of the semiconductor light-emitting element on the fluorescent substance 12 can be relieved.

In the above embodiment, the fluorescent substance 12 is also formed on the upper surface of the resin frame 19a. However, when the resin frame 19a is formed with a light-shielding material, the fluorescent substance 12 may be formed only on the mold resin 135. Furthermore, after the height of the resin frame 19a is increased and the mold resin 13 is filled to an extent that the upper end of the semiconductor light-emitting element 7c is slightly exceeded, the fluorescent substance may be disposed on the mold resin 135 in the resin frame 19a by potting or the like.

As the resin frame 19a, a part of a thick printed circuit board 18 may be removed and the remaining protruded part may be used as a frame in the same manner as described about the semiconductor light-emitting device in FIG. 12B. Furthermore, electrodes/interconnection wires composed of a metal foil may be formed at the bottom of a printed circuit board 18 having a through hole to form a recessed portion.

Furthermore, although the efficiency of taking out light to the outside declines, a resin frame that has vertically formed side surfaces facing the semiconductor light-emitting element 7c may be used.

It is noted that the semiconductor light-emitting element 7a, 7b shown in FIG. 1 may be used instead of the semiconductor light-emitting element 7c. In particular, since the semiconductor light-emitting element 7b having a conductive substrate has electrodes on both the upper and lower surfaces of the semiconductor light-emitting element 7b, which is the same electrode structure as that of a conventional GaAs or GaP semiconductor light-emitting device, a conventional lead frame can be utilized as it is.

Seventh Embodiment

Figure 14A:
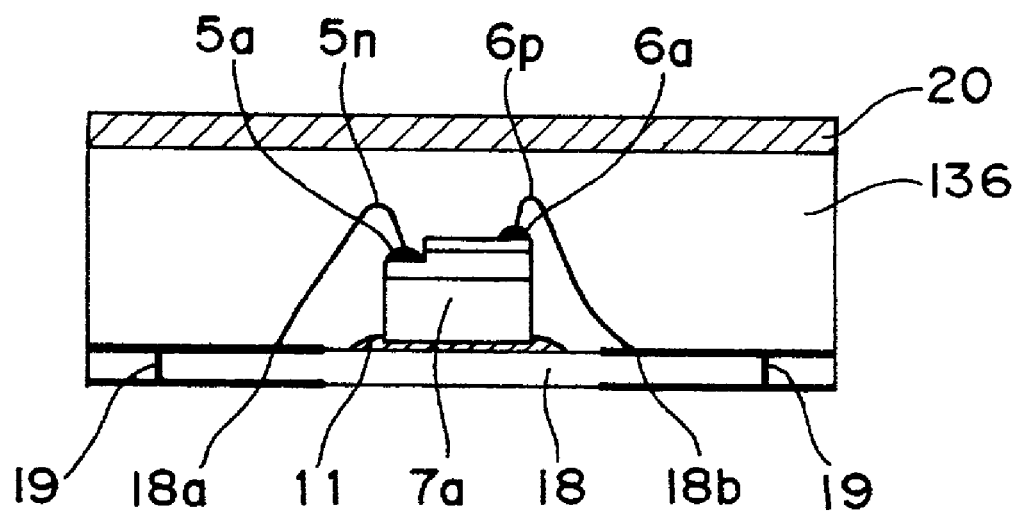
FIGS. 14A and 14B are cross sectional views viewed from the front and side, respectively, showing a semiconductor light-emitting device according to a seventh embodiment of the invention.
Figure 14B:
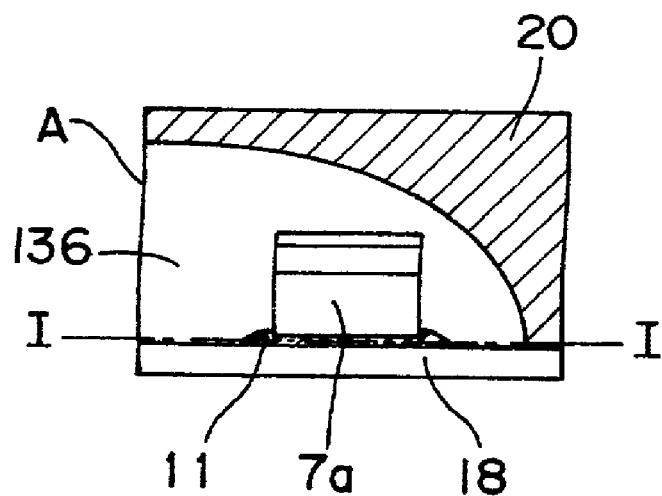

FIG. 14A and 14B are cross sectional views showing a semiconductor light-emitting device according to a seventh embodiment of the invention.

FIG. 14A is a cross sectional view of the semiconductor light-emitting device viewed from a light-emitting direction. FIG. 14B is a cross sectional view thereof viewed from a direction perpendicular to the light-emitting direction.

In this semiconductor light-emitting device, a semiconductor light-emitting element 7a is bonded on a printed circuit board 18 composed of glass epoxy as a rectangular-solid-shaped base substance with an adhesive agent 11 composed of an epoxy resin or the like. A P-side electrode 6c and an N-side electrode 5c formed on the upper surface of the semiconductor light-emitting element 7a are connected to electrode sections 18a and 18b, respectively, on the printed circuit board 18 with metallic wires 6p, 5n. These electrode sections 18a, 18b are led three-dimensionally to the lower surface via through holes 19, 19 having a circular arc cross section that penetrates through the printed circuit board 18 and then extend to both ends of a mounting surface, which is the lower surface of the printed circuit board 18. It is noted that an insulating film may be used instead of the printed circuit board 18.

Furthermore, the whole semiconductor light-emitting element 7a is sealed with a mold resin 136 as a sealing resin composed of a transmissive epoxy resin containing a dispersed fluorescent substance. This mold resin 136 has a cross section substantially in a quarter ellipse shape, wherein the left edge and the lower edge are straight lines, in FIG. 14B, while it has a rectangular cross section, wherein the edge in the width direction is longer than the edge in the height direction, in FIG. 14A. Furthermore, a reflector 20 for reflecting light from the semiconductor light-emitting element 7a is formed on the mold resin 136.

As the mold resin 136, a thermosetting resin that has transmissivity and can withstand a high temperature during solder reflow in the mounting process is preferably used. The mold resin is formed on the printed circuit board 18 by a resin potting method, a transfer mold method, an injection mold method or the like. The upper surface of the mold resin 136 bends in a parabola as shown in FIG. 14B and the semiconductor light-emitting element 7a is disposed above the central line I-I of this parabola. Furthermore, a light-emitting surface A of the mold resin 136 is planarly formed substantially on the same plane of the side surface of the printed circuit board 18. It is noted that the curved surface of the mold resin 136 may be formed so that the semiconductor light-emitting element 7a is positioned below the central line I-I of the parabola of the curved surface.

The reflector 20 contains at least a material for reflecting light from the semiconductor light-emitting element 7a and light whose wavelength is converted by the fluorescent substance 12. As in the case of the mold resin 136, the reflector is formed by using a thermosetting resin or a thermoplastic resin that can withstand a high temperature during solder reflow by a resin potting method, a transfer mold method, an injection mold method or the like so as to cover the upper surface of the mold resin 136. This reflector 20 bends while its lower edge end is brought into contact with the upper edge end of the mold resin 136 as shown in the cross section in FIG. 14B, and formed such that the left edge end is on the same plane as the light-emitting surface A of the mold resin 136 and that the right edge end of reflector 20 is a straight line leading to the right end surface of the printed circuit board 18. Furthermore, the upper end edge of the reflector is formed in parallel to the printed circuit board 18. In this semiconductor light-emitting device, the interface between the upper surface of the mold resin 136 and the lower surface of the reflector 20 is a reflecting surface. Light reflected by this reflecting surface and emitted is diffused to the left side in the horizontal direction in FIG. 14A, while blocked by the reflector 20 and the printed circuit board 18 in the vertical direction. Therefore, direct light and light reflected from the light semiconductor light-emitting element 7a have a directing characteristic restricted to the horizontal direction. The specific directing characteristic is that the half-value angle in illuminating light in the horizontal direction is ±65° and the half-value angle in the vertical direction is ±30°. Therefore, the wavelength of light from the semiconductor light-emitting element 7a is converted by the fluorescent substance 12 in the mold resin 136 and the light is directly emitted or reflected at the reflector 20 and emitted from the side surface of the mold resin 136 to the outside. Thus, a side light-emitting type semiconductor light-emitting device that has an effective illumination area wide in the horizontal direction and high brightness can be provided.

It is noted that, since the reflector 20 needs to have a reflecting action only in the portion brought into contact with the mold resin 136, a reflecting layer composed of, for example, a metal, a white paint or the like may only need to be provided on the bent upper surface of the mold resin 136 or the bent lower surface of the reflector 20.

The resin for bonding the semiconductor light-emitting element 7a on the printed circuit board 18 is not particularly limited so long as light from the semiconductor light-emitting element 7a is not absorbed. For example, a resin mixed with a metal having favorable heat conductivity to improve a heat characteristic of the semiconductor light-emitting element 7a, a resin material containing a material for efficiently reflecting and scattering light towards the mount section of the lead frame or the like may be used. However, when a resin containing a metal is used, an attention is required not to short-circuit a P-side electrode and an N-side electrode.

It is noted that the semiconductor light-emitting element 7b shown in FIG. 1B having electrodes on both the upper and lower surfaces or the semiconductor light-emitting element 7c shown in FIG. 1C emitting light from the substrate side may be used instead of the semiconductor light-emitting element 7a in the semiconductor light-emitting device of this embodiment. Since the semiconductor light-emitting element 7b has the same electrode structure as that of a conventional GaAs or GaP semiconductor light-emitting device, a conventional lead frame can be utilized as it is. Since the semiconductor-laminated surface of the semiconductor light-emitting element 7c is directly mounted on the electric interconnection wires, heat from a light-emitting region can be rapidly released to the outside through the submount and the lead frames.

Eighth Embodiment

Figure 15A:
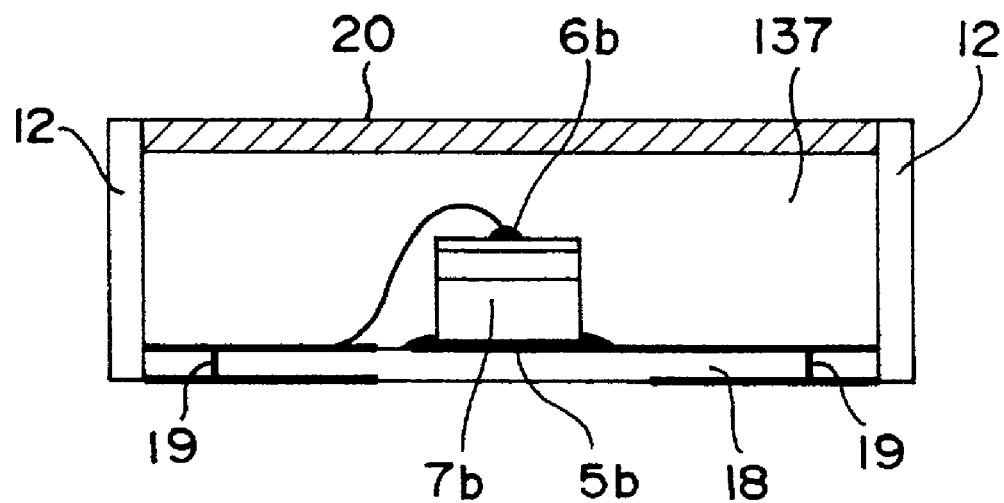
FIGS. 15A and 15B are cross sectional views viewed from the front and side, respectively, showing a semiconductor light-emitting device according to an eighth embodiment of the invention.
Figure 15B:
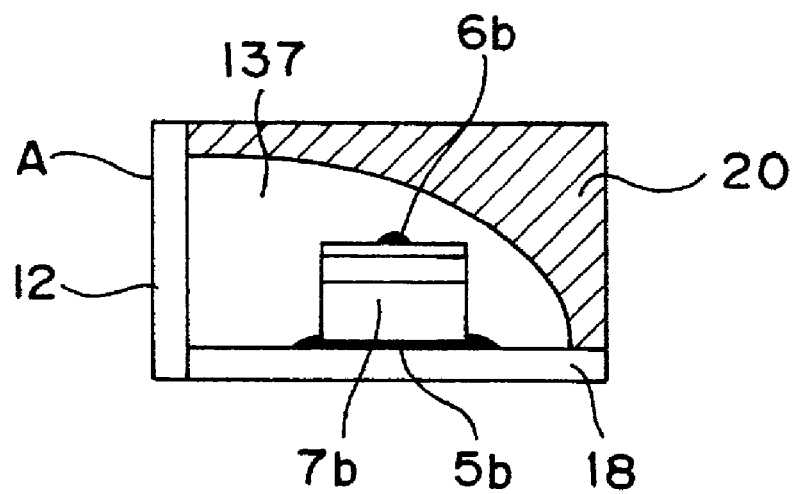

FIGS. 15A and 15B are cross sectional views showing a side light-emitting type semiconductor light-emitting device according to an eighth embodiment of the invention.

FIG. 15A is a cross sectional view of this semiconductor light-emitting device viewed from a light-emitting direction. FIG. 15B is a cross sectional view thereof viewed from a direction perpendicular to the light-emitting direction. The semiconductor light-emitting device in FIGS. 15A and 15B is the same as the semiconductor light-emitting device in FIGS. 14A and 14B except that a semiconductor light-emitting element 7b having electrodes on the upper and lower surfaces is used and that a fluorescent substance 12 is provided in a layer on a light-emitting surface A side of a mold resin 137 as a sealing resin without dispersing the fluorescent substance in the sealing resin. Therefore, component members having the same functions are designated by the same reference numerals and their detailed explanations are omitted.

In this side light-emitting type semiconductor light-emitting device, the fluorescent substance 12 is formed in a uniform layer thickness with substantially equal distances from a light-emitting region of the semiconductor light-emitting element 7b. Therefore, since the quantity of light that passes through the fluorescent substance 12 is constantly consistent substantially in all the regions, uniform emission light without unevenness can be emitted. Furthermore, since the fluorescent substance 12 is disposed at a position distant from the semiconductor light-emitting element 7b, electrical and thermal effects of the semiconductor light-emitting element 7b on the fluorescent substance 12 can be relieved. Furthermore, since the type that has electrodes on both the upper and lower surfaces of the semiconductor light-emitting element 7b has the same electrode structure as that of a conventional GaAs or GaP semiconductor light-emitting device, a conventional lead frame can be utilized as it is.

In the above embodiment of the present invention, the semiconductor light-emitting element 7a in FIG. 1A or the semiconductor light-emitting element 7c in FIG. 1C may be used instead of the semiconductor light-emitting element 7b.

Ninth Embodiment

Figure 16A:
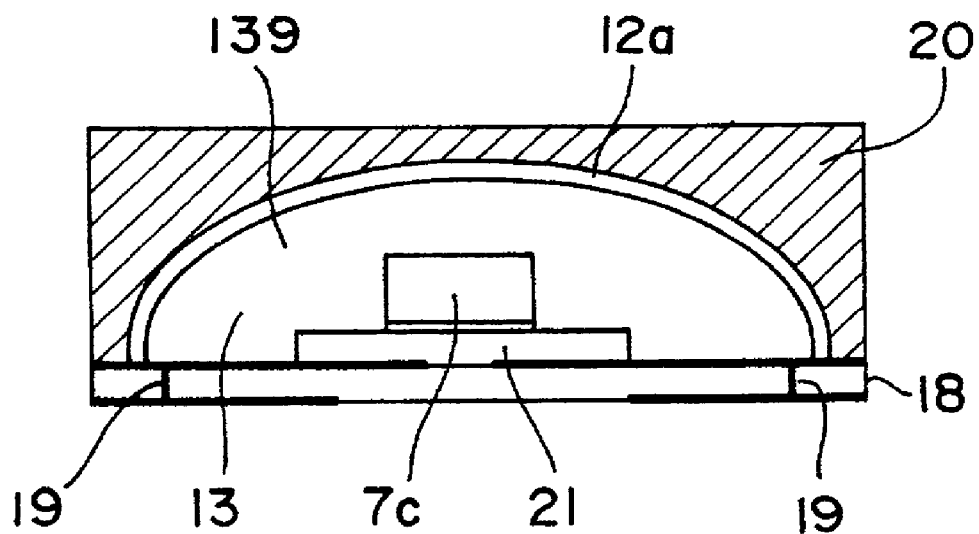
FIGS. 16A and 16B are cross sectional views viewed from the front and side, respectively, showing a semiconductor light-emitting device according to a ninth embodiment of the invention.
Figure 16B:
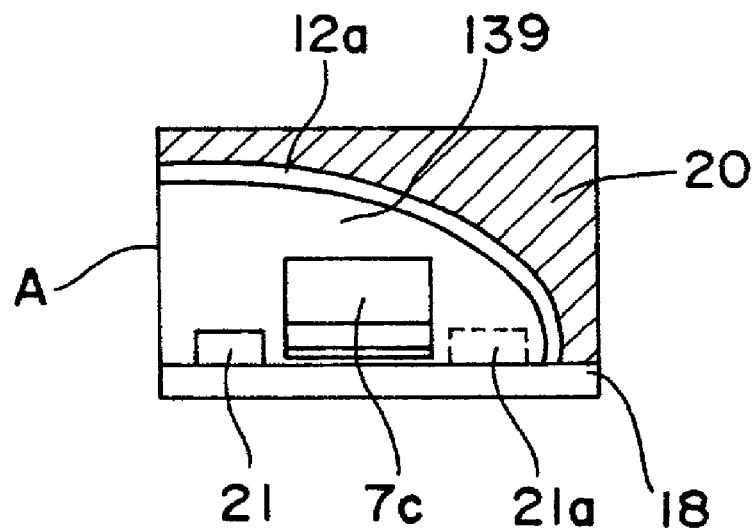

FIGS. 16A and 16B are cross sectional views showing a side light-emitting type semiconductor light-emitting device according to a ninth embodiment of the invention.

FIG. 16A is a cross sectional view of this semiconductor light-emitting device viewed from a light-emitting direction. FIG. 16B is a cross sectional view thereof viewed from a direction perpendicular to the light-emitting direction. In this semiconductor light-emitting device, a mold resin 139 as sealing resin for sealing a semiconductor light-emitting element 7c is formed on a printed circuit board 18 as a base substance. This mold resin 139 has a cross section substantially in a half ellipse shape in FIG. 16A, looking as if a lower half of an ellipse is removed, and a cross section substantially in a quarter ellipse shape in FIG. 16B, looking as if the left-side and lower portions of an ellipse are removed. That is, the surface of the mold resin 139 excluding a light-emitting surface A constitutes a dome shape having a predetermined radius of curvature on the printed circuit board 18. Furthermore, a fluorescent substance layer 12a as a fluorescent substance is formed so as to cover a curved surface portion of the outside surface of this mold resin 139. A reflector 20 for reflecting light from the semiconductor light-emitting element 7c is further formed on its outside surface.

Furthermore, a barrier body 21 as a shielding body for shielding light so as not to emit light from the semiconductor light-emitting element 7c directly to the outside is formed on the light-emitting surface A side of the semiconductor light-emitting element 7c on the printed circuit board 18. This barrier body 21 has a height and width enough to shield the light-emitting region of the semiconductor light-emitting element 7c viewed from the light-emitting surface A side of the semiconductor light-emitting device (see FIG. 16A) and is formed by using a resin, a metal or the like that does not transmit light from the semiconductor light-emitting element 7c. Furthermore, a material that absorbs light can be utilized as a material of the barrier body 21. In this case, however, light use efficiency is deteriorated. Furthermore, a barrier body 21a composed of a resin frame surrounding the semiconductor light-emitting element 7c may be used as shown with a broken line in FIG. 16B. Furthermore, to shield light directly emitted from the semiconductor light-emitting element 7c, a recessed portion may be formed in a part of a thick printed circuit board and the semiconductor light-emitting element may be disposed in this recessed portion so that the light-emitting region is hidden. Since the semiconductor light-emitting element 7c is mounted on the printed circuit board 18 by directly connecting the semiconductor-laminated side, heat from the light-emitting region can be rapidly released through the submount and the lead frames. Furthermore, since the light-emitting region of the semiconductor light-emitting element is positioned in the lower portion, the height of the barrier body can be reduced, thereby achieving high light use efficiency. It is noted that the shielding bodies 21, 21a and the recessed portion can be used in the semiconductor light-emitting device of the seventh embodiment shown in FIGS. 14A and 14B.

After the wavelength of outgoing light from the semiconductor light-emitting element 7c is converted by the fluorescent substance layer 12a, the outgoing light is reflected by the reflector 20 brought into contact with this fluorescent substance layer 12a and the wavelength is converted by the fluorescent substance layer 12a again. Then, the light is emitted to the outside of the semiconductor light-emitting device. Therefore, this semiconductor light-emitting device has wavelength conversion efficiency substantially twice as high as that of a semiconductor light-emitting device having a fluorescent substance disposed in the light-emitting direction so as to transmit light from the semiconductor light-emitting element. Therefore, since a sufficient wavelength conversion effect can be expected even when the fluorescent substance layer 12a is made thinner, the amount of the used fluorescent substances can be reduced, thereby reducing costs for manufacturing the semiconductor light-emitting device.

The fluorescent substance layer 12a in the above embodiment converts the wavelength by transmitting light. A fluorescent substance that does not transmit light, but converts the wavelength and reflects the light can be formed as a reflector. Such examples include a fluorescent substance wherein its fine particles reflect and scatter light and the surfaces are coated with a fluorescent material or the like.

In this embodiment, the semiconductor light-emitting elements 7a, 7b in FIGS. 1A and 1B may be used instead of the semiconductor light-emitting element 7c. In particular, since the semiconductor light-emitting element 7b having a conductive substrate has the same electrode structure similar to that of a conventional GaAs or GaP semiconductor light-emitting device that has electrodes on both the upper and lower surfaces, a conventional lead frame can be utilized as it is.

Tenth Embodiment

Figure 17A:
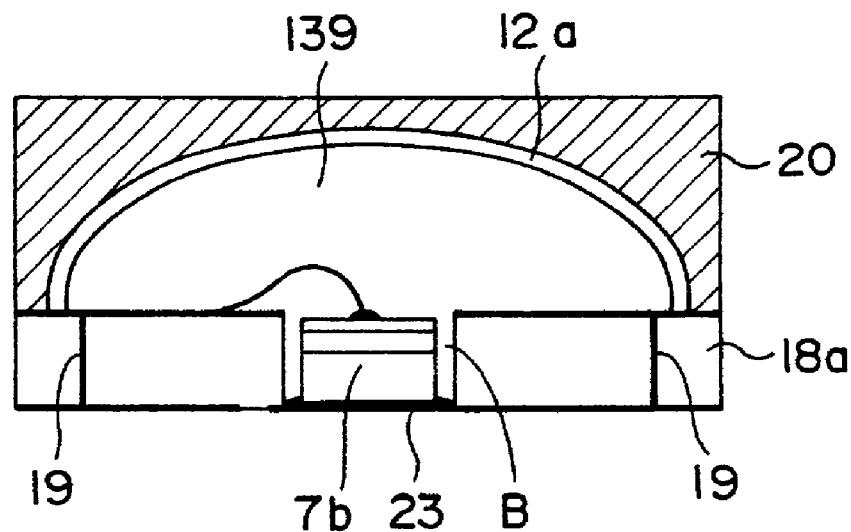
FIGS. 17A and 17B are cross sectional views viewed from the front and side, respectively, showing a semiconductor light-emitting device according to a tenth embodiment of the invention.
Figure 17B:
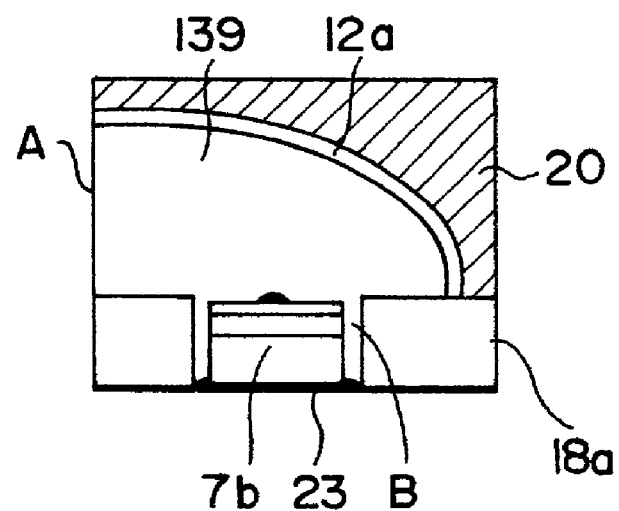

FIGS. 17A and 17B are cross sectional views showing a side light-emitting type semiconductor light-emitting device according to a tenth embodiment of the invention.

FIG. 17A is a cross sectional view of this semiconductor light-emitting device viewed from a light-emitting direction. FIG. 17B is a cross sectional view thereof viewed from a direction perpendicular to the light-emitting direction. This embodiment is the same as the ninth embodiment shown in FIGS. 16A and 16B except that the semiconductor light-emitting element 7b having a conductive substrate is used instead of the semiconductor light-emitting element 7c and that a printed circuit board 18a as a base substance constituted by attaching an ultrathin printed circuit board 23 composed of a metal foil provided with electrodes/interconnection wires at the bottom surface composed of a glass epoxy substrate having a through hole B is used instead of the printed circuit board 18.

As shown in FIGS. 17A and 17B, in this side light-emitting type semiconductor light-emitting device, the semiconductor light-emitting element 7b is formed on the ultrathin printed circuit board 23 so as to be hidden in the through hole B in the printed circuit board 18a. Therefore, since the thickness of the printed circuit board 18a is higher than the semiconductor light-emitting element 7b, the semiconductor light-emitting device can be made thinner. Since a light-emitting region of the semiconductor light-emitting element 7b is completely hidden from the outside, light from the semiconductor light-emitting element 7b is not directly emitted to the outside. That is, since only light whose wavelength is converted by a fluorescent substance layer 12a as a fluorescent substance is emitted outside of the semiconductor light-emitting device, color tones of the semiconductor light-emitting device are further improved. It is noted that the through hole B needs to be deep only enough to hide at least the light-emitting region of the semiconductor light-emitting element 7b when viewed from the light-emitting surface A (see FIG. 17B) side.

In the above embodiment, the semiconductor light-emitting element 7a, 7c shown in FIGS. 1A and 1C may be used instead of the semiconductor light-emitting element 7b. In particular, since the light-emitting region is positioned near the bottom of the through hole B when the semiconductor light-emitting element 7c is disposed in the through hole B, the semiconductor light-emitting device can be further made thinner.

Eleventh Embodiment

FIGS. 18A, 18B and 18C and FIGS. 19A, 19B and 19C show wavelength distributions of light emitted from a semiconductor light-emitting device according to an eleventh embodiment of the invention. This semiconductor light-emitting device has a semiconductor light-emitting element on a base substance. Outgoing light of this semiconductor light-emitting element has a light-emitting wavelength peak at 410 nm in a wavelength range of 390 to 420 nm. Furthermore, this semiconductor light-emitting device has first, second and third fluorescent substances, which converts the outgoing light of the semiconductor light-emitting element. The semiconductor light-emitting element is sealed with a sealing resin composed of a resin that is not damaged by this semiconductor light-emitting element. The first, second and third fluorescent substances are contained in this sealing resin while mixed in a substantially uniform manner. The first fluorescent substance is composed of $0.5MgF_2 \cdot 3.5MgO \cdot GeO_2$: Mn fluorescent substance and excited by outgoing light of the semiconductor light-emitting element to emit red light having emission wavelengths with its main peak at 658 nm. The second fluorescent substance is composed of $SrAl_2O_4$: Eu fluorescent substance and emits green light having emission wavelengths with its main peak at 522 nm. The third fluorescent substance is composed of $BaMgAl_{10}O_{17}$: Eu fluorescent substance and emits blue light having emission wavelengths with its main peak at 452 nm. This semiconductor light-emitting device emits white light by mixing colors of the outgoing light from the first, second and third fluorescent substances and is used as a light source for a backlight for a display device of a cellular phone, a mobile data terminal, a personal computer or the like. It is noted that the emission wavelength peak of the semiconductor light-emitting element is in the wavelength range of 390 to 420 nm, but more preferably in the wavelength range of 400 to 420 nm.

Figure 18A:
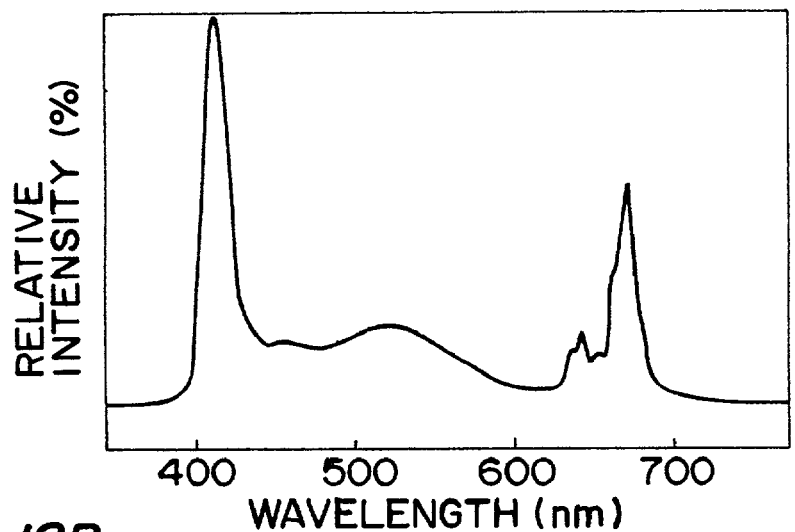
FIGS. 18A, 18B and 18C show wavelength distributions of outgoing light from the semiconductor light-emitting device in which contents of the first fluorescent substance, the second fluorescent substance and the third fluorescent substance are different, respectively.
Figure 18B:
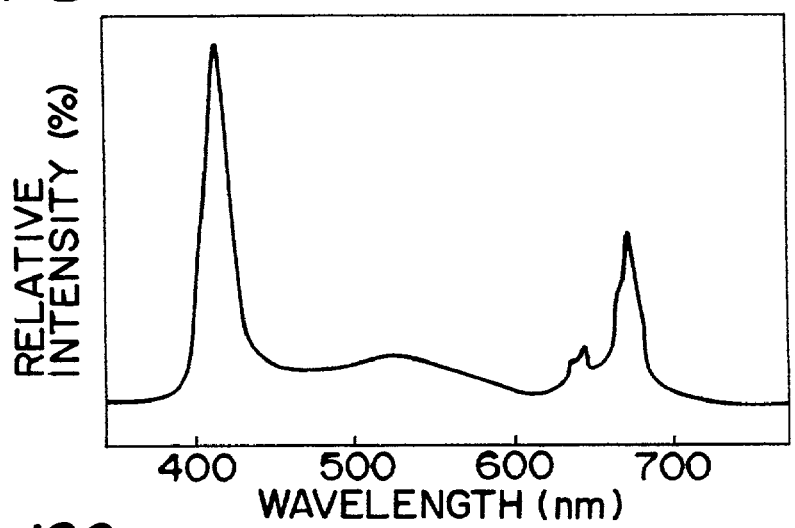
Figure 18C:
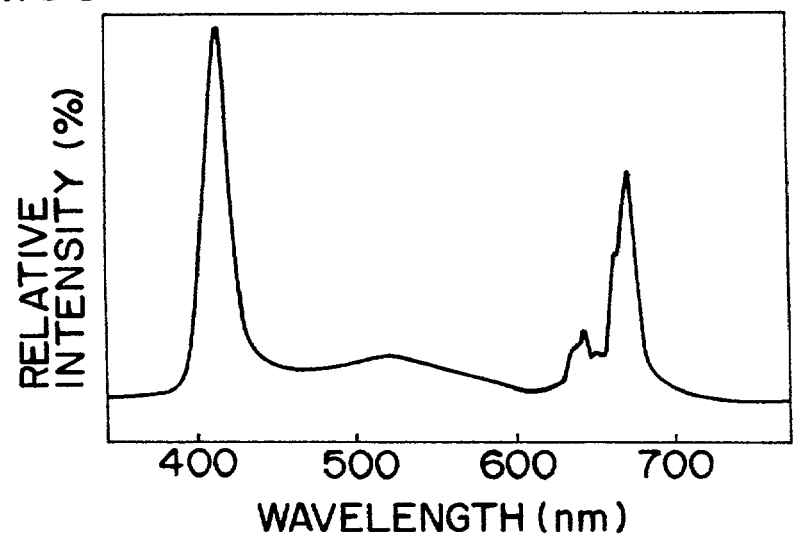

FIGS. 18A, 18B and 18C show changes in the wavelength distributions of the outgoing light when the mixture proportions of the first, second and third fluorescent substances are changed in this semiconductor light-emitting device. In all the graphs, the horizontal axis represents wavelength (nm) and the vertical axis represents relative intensity (%). Furthermore, the proportion of the total weight of the first, second and third fluorescent substances to the weight of the sealing resin is 0.5 in each case.

FIG. 18A shows a wavelength distribution of the outgoing light from the semiconductor light-emitting device containing 47 weight % of the first fluorescent substance, 13 weight % of the second fluorescent substance and 40 weight % of the third fluorescent substance, assuming that the total amount of the first, second and third fluorescent substances is 100 weight %. The outgoing light of the semiconductor light-emitting device becomes white with a color tone tinged with green in this case.

FIG. 18B shows a wavelength distribution of the outgoing light from the semiconductor light-emitting device containing 56 weight % of the first fluorescent substance, 11 weight % of the second fluorescent substance and 33 weight % of the third fluorescent substance, assuming that the total amount of the first, second and third fluorescent substances is 100 weight %. The outgoing light of the semiconductor light-emitting device becomes white with a favorable color tone in this case.

FIG. 18C shows a wavelength distribution of the outgoing light from the semiconductor light-emitting device containing 65 weight % of the first fluorescent substance, 26 weight % of the second fluorescent substance and 9 weight % of the third fluorescent substance, assuming that the total amount of the first, second and third fluorescent substances is 100 weight %. The outgoing light of this semiconductor light-emitting device become white with a color tone tinged with red, so-called neutral white, in this case.

A semiconductor light-emitting device containing $La_2O_2S$: Eu as the first fluorescent substance, $BaMg_2Al_{16}O_{27}$: Eu, Mn as the second fluorescent substance and $(Sr, Ca, Mg, Ce)_{10}(PO_4)_6Cl_2$: Eu as the third fluorescent substance in proportion of 72 weight %, 7 weight % and 21 weight %, respectively, was formed. The outgoing light of this semiconductor light-emitting device was favorable white light. Furthermore, a semiconductor light-emitting device containing the first, second and third fluorescent substances in proportion of 58 weight %, 22 weight % and 20 weight %, respectively, also obtained favorable white outgoing light. In consideration to the above experimental results, it was found that the luminous color of the semiconductor light-emitting device became white with a color tone tinged with green when the mixture proportion of the first fluorescent substance, that is, red light emitting fluorescent substance was less than 50 weight %, while white with a color tone tinged with red was obtained when the mixture proportion of the first fluorescent substance was more than 70 weight %. Furthermore, it was found that the luminous color of the semiconductor light-emitting device became white with a color tone tinged with red when the mixture proportion of the second fluorescent substance, that is, green light emitting fluorescent substance was less than 7 weight %, while white with a color tone tinged with green was obtained when the mixture proportion of the second fluorescent substance was more than 20 weight %. Furthermore, it was found that the luminous color of the semiconductor light-emitting device became white with a color tone tinged with red when the mixture proportion of the third fluorescent substance, that is, blue light emitting fluorescent substance was less than 20 weight %, while white with a color tone tinged with green was obtained when the mixture proportion of the third fluorescent substance is larger than 30 weight %. Therefore, the semiconductor light-emitting device of the eleventh embodiment can obtain favorable white outgoing light when the proportion of the total weight of the first to third fluorescent substances to the weight of sealing resin is 0.5 and the mixture proportions of the first, second and third fluorescent substances are 56 weight %, 11 weight % and 33 weight %, respectively.

Figure 19A:
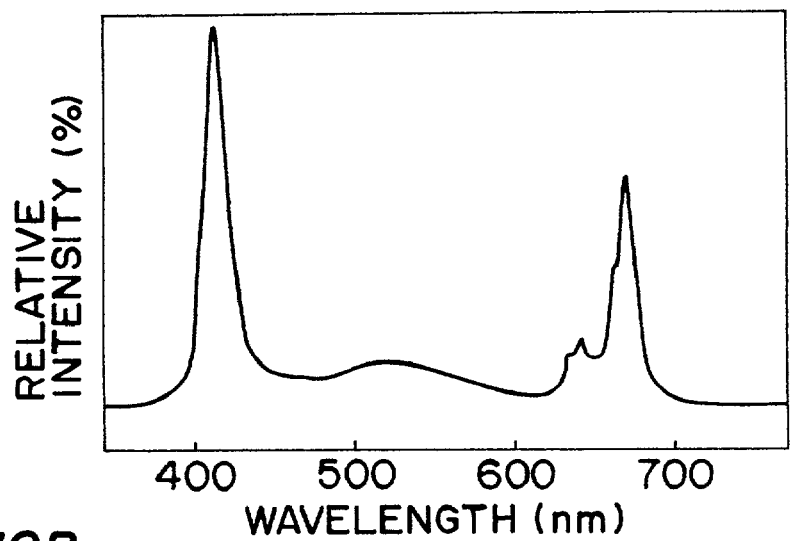
FIGS. 19A, 19B and 19C show wavelength distributions of outgoing light from the semiconductor light-emitting device when the proportion of the total weight of the first, second and third fluorescent substances to the weight of the sealing resin is 0.5, 0.66 and 1.0, respectively.
Figure 19B:
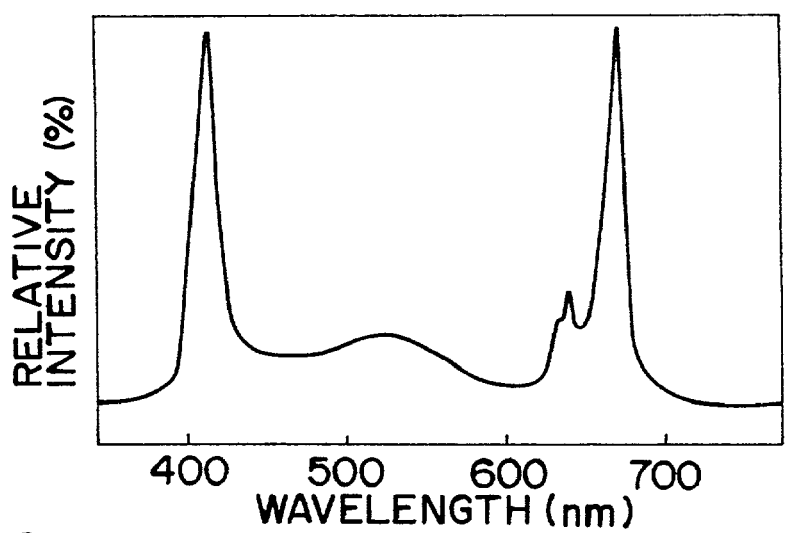
Figure 19C:
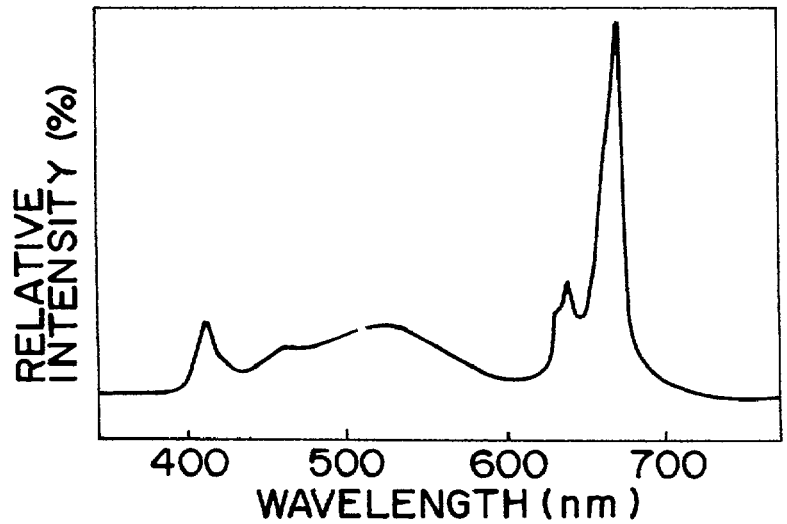

FIGS. 19A, 19B and 19C show changes in the wavelength distributions of the outgoing light when the proportion of the total weight of the first, second and third fluorescent substances to the weight of the sealing resin is changed in this semiconductor light-emitting device. In all the graphs, the horizontal axis represents wavelength (nm) and the vertical axis represents relative intensity (%). Furthermore, in each case, the mixture proportions of the first, second and third fluorescent substances are 65 weight %, 26 weight % and 9 weight %, respectively, assuming that the total amount of the first, second and third fluorescent substances is 100 weight %.

FIG. 19A shows a wavelength distribution of the outgoing light from the semiconductor light-emitting device when the proportion of the total weight of the first, second and third fluorescent substances to the weight of the sealing resin is 0.5. The outgoing light of this semiconductor light-emitting device becomes white with a color tone tinged with red, so-called neutral white, in this case.

FIG. 19B shows a wavelength distribution of the outgoing light from the semiconductor light-emitting device when the proportion of the total weight of the first, second and third fluorescent substances to the weight of the sealing resin is 0.66. The outgoing light of the semiconductor light-emitting device becomes white with a favorable color tone in this case.

FIG. 19C shows a wavelength distribution of the outgoing light from the semiconductor light-emitting device when the proportion of the total weight of the first, second and third fluorescent substances to the weight of the sealing resin is 1.0. The outgoing light of the semiconductor light-emitting device becomes white with a color tone tinged with green in this case.

From FIGS. 19A, 19B and 19C, the semiconductor light-emitting device can obtain white outgoing light with a favorable color tone when the mixture proportions of the first, second and third fluorescent substances are 65weight %, 26 weight % and 9 weight %, respectively, and the proportion of the total weight of the first to third fluorescent substances to the weight of sealing resin is between 0.5 and 1.0 inclusive.

Figure 20:
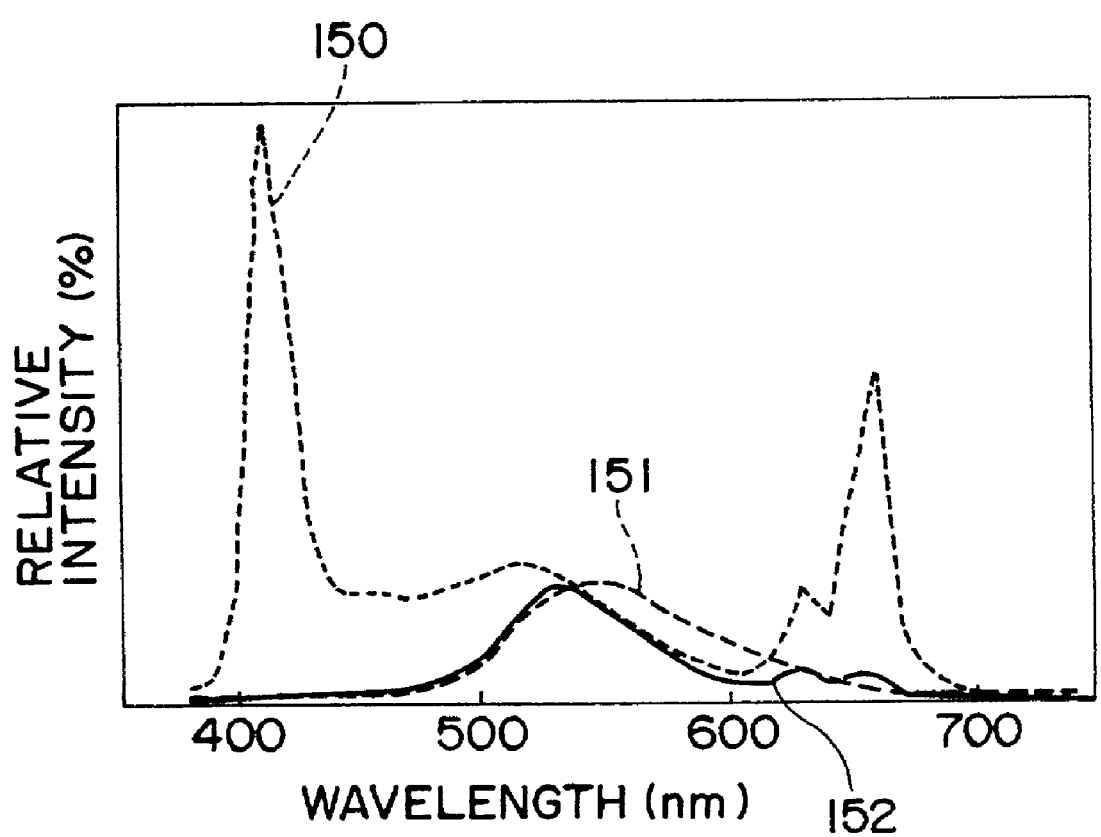
FIG. 20 shows an emission spectrum 150 of the semiconductor light-emitting device shown in FIG. 19A and an effective emission spectrum 152 of the semiconductor light-emitting device in consideration to human relative visibility 151.

FIG. 20 shows an effective emission spectrum 152 of the semiconductor light-emitting device in consideration to the emission spectrum 150 of the semiconductor light-emitting device shown in FIG. 19A and human relative visibility 151. The horizontal axis represents wavelength (nm) and the vertical axis represents relative intensity As shown in FIG. 20, the emission spectrum 150 of the semiconductor light-emitting device has a wider emission wavelength range than the wavelength range of human relative visibility 151. Since the effective emission spectrum 152 of the wavelength range that covers the wavelength range of the relative visibility 151 can be obtained, a white luminous color having a favorable color tone for the human visual sense can be achieved.

Furthermore, since the sealing resin is a resin that is not damaged by outgoing light from the semiconductor light-emitting element in the semiconductor light-emitting device, this sealing resin does not suffer trouble such as, for example, blackening or the like. Therefore, trouble such as lower brightness of the semiconductor light-emitting device or the like can be prevented and thus the semiconductor light-emitting device can maintain stable performances over a long period.

In the above semiconductor light-emitting device, by using a plurality of kinds of fluorescent substances as the first, second and third fluorescent substances, the wavelength range of the effective emission spectrum 152 may be made substantially equal to the wavelength range of the human relative visibility 151. Consequently, luminous colors of the semiconductor light-emitting device can have favorable color tones. Furthermore, since the emission wavelength range of the semiconductor light-emitting device needs to cover only the human visible range, the light-emitting efficiency of the semiconductor light-emitting device can be improved.

In the semiconductor light-emitting device of this embodiment, the first, second and third fluorescent substances are mixed substantially uniformly into the sealing resin for sealing the semiconductor light-emitting element. However, after only the first, second and third fluorescent substances are mixed, this fluorescent substance mixture may be disposed in a layer on the sealing resin surface or the first, second and third fluorescent substances may be provided separately in respective layers on the sealing resin surface. In this case, it is preferable in consideration to the light emitting and absorbing wavelengths or the like that these layers are disposed in the order of the emission wavelength of each fluorescent substance contained in the layer from the side closer to the semiconductor light-emitting element towards the side farther therefrom, the one with the shortest wavelength first. Furthermore, the semiconductor device of this embodiment may be formed in the same structure as that of the semiconductor light-emitting devices of the above-described first to tenth embodiments. Consequently, white light can be emitted with a favorable color tone in lamp-type, chip component type and side light-emitting type semiconductor light-emitting devices.

Twelfth Embodiment

Figure 21:
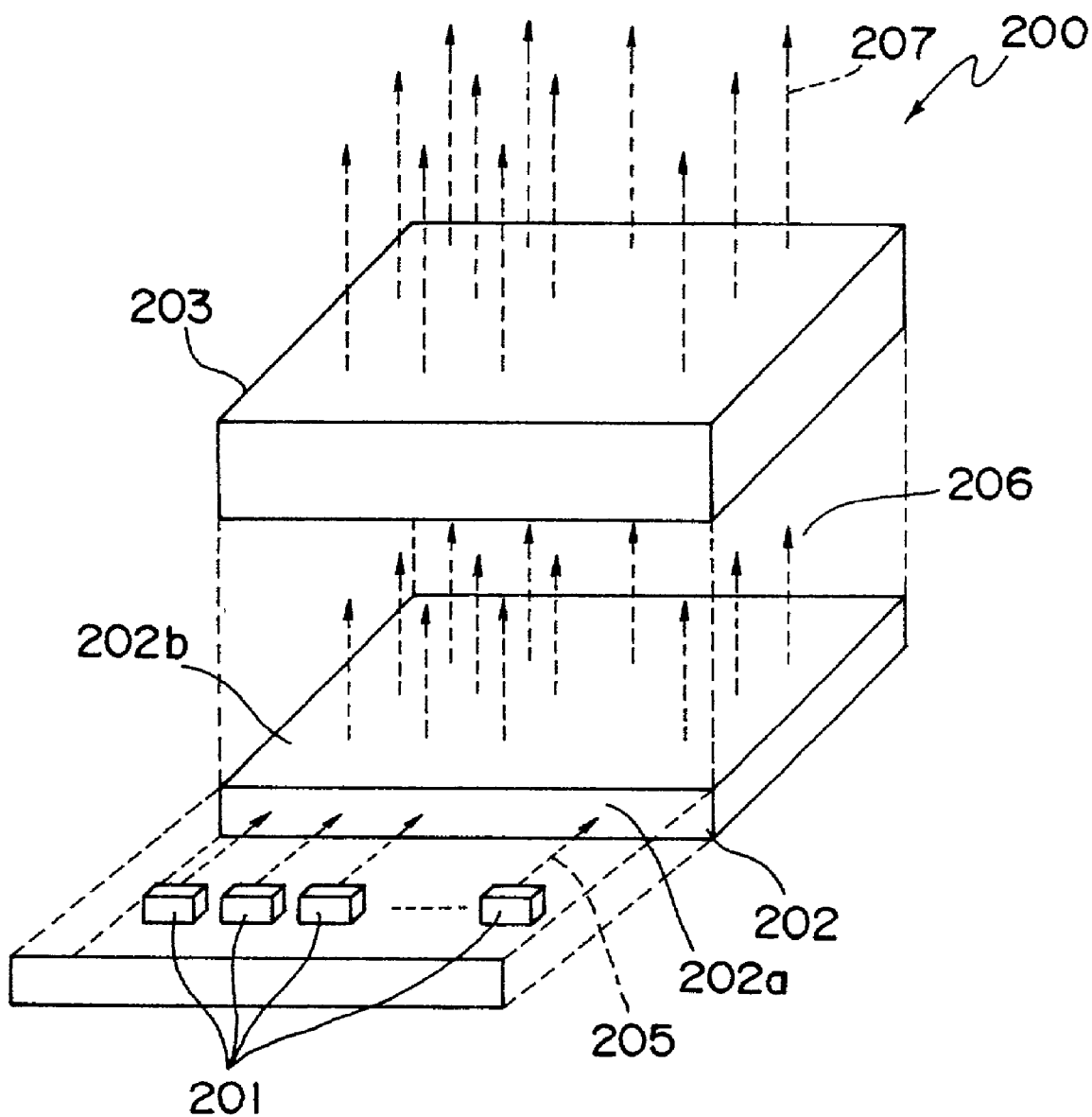
FIG. 21 is a schematic view showing a light-emitting display device according to a twelfth embodiment of the invention.

FIG. 21 is a schematic view showing a light-emitting display device according to a twelfth embodiment of the invention. This light-emitting display device 200 is a liquid crystal display device having a light source 201 composed of the semiconductor light-emitting device of the eleventh embodiment, a light guiding plate 202 for guiding light 205 from the light source 201 and a liquid crystal panel 203 including color filters for dividing light from this light guiding plate 202.

The light source 201 may be formed by using any one of the semiconductor light-emitting devices of the first to eleventh embodiments. In particular, when the light-emitting display device 200 is used as a display device of a cellular phone, a mobile data terminal, a personal computer or the like, the semiconductor light-emitting device that emits white light as in the same manner as in the eleventh embodiment is preferred as the light source 201. Furthermore, when the first, second and third fluorescent substances used in the semiconductor light-emitting device of the eleventh embodiment are used as the fluorescent substance for the semiconductor light-emitting devices of the fourth to sixth embodiments, a chip-component-shaped semiconductor light-emitting device that can emit white light can be obtained. Since this semiconductor light-emitting device has a chip component shape, it can be readily handled when mounted on the light-emitting display device 200. Furthermore, since this chip-component-shaped semiconductor light-emitting device can be directly attached to a side surface 202a of the light guiding plate 202, emission light can be efficiently guided to the light guiding plate 202. Furthermore, when a light source 201a is constituted by using a semiconductor light-emitting device obtained by mounting the fluorescent substances of the eleventh embodiment on the semiconductor light-emitting devices of the seventh to tenth embodiments, the thickness of the light-emitting display device 200 in the light-emitting direction of the light guiding plate 202 can be effectively reduced by attaching the semiconductor light-emitting device on a side surface 202a of the light guiding plate 202 so that the printed circuit board 18 as a base substance is substantially in parallel to the light guiding plate 202 since this semiconductor light-emitting device is of a side light-emitting type. A plurality of semiconductor light-emitting devices are used for this light source 201, but the light source may also be constituted by one semiconductor light-emitting device so long as the light intensity is sufficient.

The light guiding plate 202 is formed by using, for example, a polycarbonate resin, an acrylic resin or the like. When a light-reflecting section is formed on a side surface 202a, into which light from the light source 201 is introduced, and surfaces other than the light-emitting surface 202b, from which the introduced light is emitted, light from the light source 201 can be efficiently emitted from the light-emitting surface 202b. Furthermore, light to the light guiding plate 202 may be introduced not only from one side surface 202a, but may be introduced from, for example, two side surfaces opposed to each other, or three or four side surfaces. Furthermore, to make the intensity of light emitted from the light-emitting surface 202b uniform, a light-scattering agent may be mixed in the light guiding plate 202 or the bottom surface in FIG. 21, which is opposed to the light-emitting surface 202b, may be inclined so that light introduced from the side surface 202a of the light guiding plate 202 is reflected at the inclined bottom surface and emitted from the light-emitting surface 202b. When a light-scattering pattern is provided on the bottom surface, the intensity of light 206 from the light-emitting surface 202b can be made further uniform.

The liquid crystal panel 203 has two transparent substrates each having a transparent electrode, a liquid crystal sealed between the two substrates, a polarizing plate and color filters bonded on the substrates. As the color filters, red, green and blue color filters are formed corresponding to a plurality of picture elements, wherein the quantity of light that is transmitted through the liquid crystal is adjusted by signals applied to the transparent electrodes. The red, green and blue color filters are formed by coloring a sheet formed by polycarbonate, polyethylene terephthalate or the like in red, green and blue by using a light-transmitting dye, a pigment or the like so that picture elements in a fine honeycomb shape or a delta array shape are formed.

Figure 22:
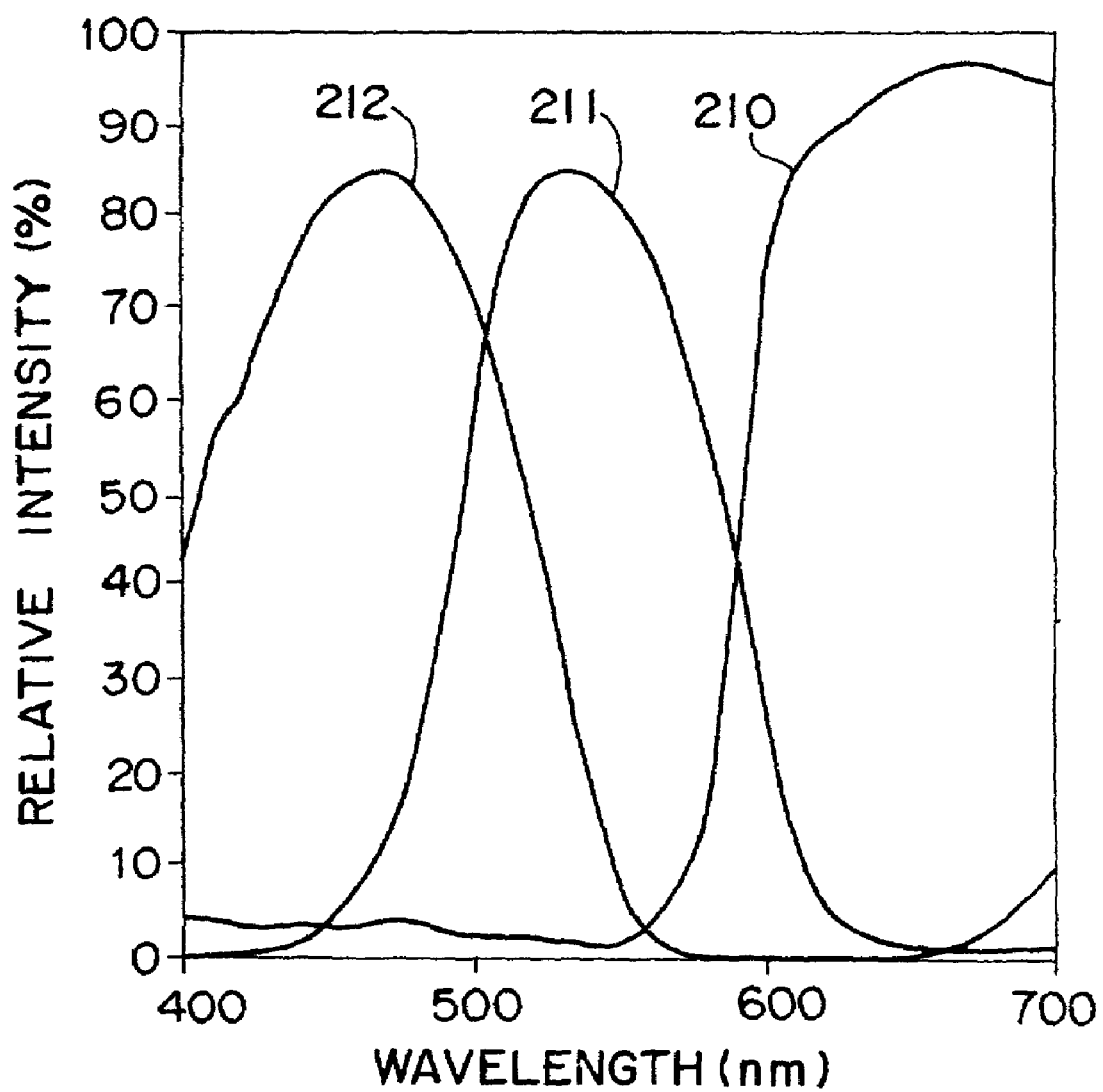
FIG. 22 shows spectral characteristics of color filters installed in the light-emitting display device of the present invention.

FIG. 22 shows spectral characteristics of the color filters. Reference numeral 210 represents a spectral characteristic of a red color filter. Reference numeral 211 represents a spectral characteristic of a green color filter. Reference numeral 212 represents a spectral characteristic of a blue color filter.

The wavelength distribution of light from the light source 201 is adjusted so as to match the spectral characteristics 210, 211, 212 of these color filters. More specifically, in a semiconductor light-emitting device constituting a light source 201, the emission wavelength of the semiconductor light-emitting element, the emission wavelength and mixture proportions of the first, second and third fluorescent substances, mixture proportion of the total weight of the first to third fluorescent substances to the weight of the sealing resin and so forth are adjusted so that the wavelength distribution of the light 205 from the light source 201 matches the spectral characteristics 210, 211, 212 of the color filters. For example, the semiconductor light-emitting device having the wavelength distribution in FIG. 19B having favorable color tones matches the spectral characteristics in FIG. 22. This is because the mixture proportion of the total weight of the first to third fluorescent substances to the weight of the sealing resin is adjusted to match the above spectral characteristics in this semiconductor light-emitting device. Thus, the light source 201 has a wavelength distribution that matches spectral characteristics of the color filters. Therefore, when the light 205 from this light source 201 is guided to the liquid crystal panel 203 via the light guiding plate 202, the light is divided into substantially homogeneous red, green and blue light 207 with high brightness by the color filters of this liquid crystal panel 203. As a result, this light-emitting display device 200 can display an image or picture having favorable color tones as well as high brightness and contrast.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor light-emitting device constituted by mounting a semiconductor light-emitting element on a base substance, wherein the semiconductor light-emitting element emits light having an emission wavelength only in a range of 390 to 420 nm, the light having visibility lower than light in a visible range more than 420 nm; and there is included a fluorescent substance that is excited by outgoing light from the semiconductor light-emitting element and emits red light having an emission wavelength with its main emission peak in a wavelength range of 600 to 670 nm, wherein the fluorescent substance is composed of any one or more selected from a fluorescent substance group consisting of:

$M_2O_2S$: Eu (M is any one or more elements selected from La, Gd and Y);

$0.5MgF_2.3.5MgO.GeO_2$: Mn;

$Y_2O_3$: Eu;

Y(P, V) $O_4$: Eu; and $YVO_4$: Eu.

2. A semiconductor light-emitting device constituted by mounting a semiconductor light-emitting element on a base substance, wherein the semiconductor light-emitting element has-eutgei**g emits light having an emission wavelength only in a range of 390 to 420 nm, the light having visibility lower than light in a visible range more than 420 nm; and there is included a fluorescent substance that is excited by outgoing light from the semiconductor light-emitting element and emits green light having an emission wavelength with its main emission peak in a wavelength range of 500 to 540 nm, wherein the fluorescent substance is composed of any one or more selected from a fluorescent substance group consisting of:

$RMg_2Al_{16}O_{27}$: Eu, Mn (R is any one or both elements selected from Sr and Ba);

$RMgAl_{10}O_{17}$: Eu, Mn (R is any one or both elements selected from Sr and Ba);

ZnS: Cu;

$SrAl_2O_4$: Eu;

$SrAl_2O_4$: Eu, Dy;

ZnO: Zn;

$Zn_2Ge_2O_4$: Mn;

$Zn_2SiO_4$: Mn; and $Q_3MgSi_2O_8$: Eu, Mn (Q is any one or more elements selected from Sr, Ba and Ca).

3. A semiconductor light-emitting device constituted by mounting a semiconductor light-emitting element on a base substance, wherein the semiconductor light-emitting element emits light having an emission wavelength only in a range of 390 to 420 nm, the light having visibility lower than light in a visible range more than 420 nm; and there is included a fluorescent substance that is excited by outgoing light from the semiconductor light-emitting element and emits blue light having an emission wavelength with its main emission peak in a wavelength range of 410 to 480 nm, wherein the fluorescent substance is composed of any one or more selected from a fluorescent substance group consisting of:

$A_{10}(PO_4)_6Cl_2$: Eu (A is any one or more elements selected from Sr, Ca, Ba, Mg and Ce);

$XMg_2Al_{16}O_{27}$: Eu (X is any one or both elements selected from Sr and Ba);

$XMgAl_{10}O_{17}$: Eu (X is any one or both elements selected from Sr and Ba);

ZnS: Ag;

$Sr_{10}(PO_4)_6Cl_2$: Eu;

$Ca_{10}(PO_4)_6F_2$: Sb;

$Z_3MgSi_2O_8$: Eu (Z is any one or more elements selected from Sr, Ca and Ba);

$SrMgSi_2O_8$: Eu;

$Sr_2P_2O_7$: Eu; and $CaAl_2O_4$: Eu, Nd.

4. A semiconductor light-emitting device constituted by mounting a semiconductor light-emitting element on a base substance, wherein the semiconductor light-emitting element emits light having an emission wavelength only in a range of 390 to 420 nm, the light having visibility lower than light in a visible range more than 420 nm; and there is included a fluorescent substance that is excited by outgoing light from the semiconductor light-emitting element and emits blue green light having an emission wavelength with its main emission peak in a wavelength range of 480 to 500 nm, wherein the fluorescent substance is composed of any one or more selected from a fluorescent substance group consisting of:

$Sr_4Al_{14}O_{25}$: Eu;

$Sr_4Al_{14}O_{25}$: Eu, Dy;

$L_{10}(PO_4)_6Cl_2$: Eu (L is any one or more elements selected from Ba, Ca and Mg); and $Sr_2Si_3O_8.2rCl_2$: Eu.

5. A semiconductor light-emitting device constituted by mounting a semiconductor light-emitting element on a base substance, wherein the semiconductor light-emitting element emits light having an emission wavelength only in a range of 390 to 420 nm, the light having visibility lower than light in a visible range more than 420 nm; and there is included a fluorescent substance that is excited by outgoing light from the semiconductor light-emitting element and emits orange light having an emission wavelength with its main emission peak in a wavelength range of 570 to 600 nm.

6. The semiconductor light-emitting device according to claim 5, wherein the fluorescent substance is composed of any one or more selected from a fluorescent substance group consisting of:

ZnS: Mn; and
ZnS: Cu, Mn, Co.

7. The semiconductor light-emitting device according to claim 1, wherein the base substance is a substrate provided with metallic wiring;
the semiconductor light-emitting element is electrically connected to the metallic wiring on the substrate and disposed in a recessed portion; and
the fluorescent substance is filled in the recessed portion.

8. The semiconductor light-emitting device according to claim 2, wherein the base substance is a substrate provided with metallic wiring;
the semiconductor light-emitting element is electrically connected to the metallic wiring on the substrate and disposed in a recessed portion; and
the fluorescent substance is filled in the recessed portion.

9. The semiconductor light-emitting device according to claim 3, wherein the base substance is a substrate provided with metallic wiring;
the semiconductor light-emitting element is electrically connected to the metallic wiring on the substrate and disposed in a recessed portion; and
the fluorescent substance is filled in the recessed portion.

10. The semiconductor light-emitting device according to claim 4, wherein the base substance is a substrate provided with metallic wiring;
the semiconductor light-emitting element is electrically connected to the metallic wiring on the substrate and disposed in a recessed portion; and
the fluorescent substance is filled in the recessed portion.

11. The semiconductor light-emitting device according to claim 5, wherein the base substance is a substrate provided with metallic wiring;
the semiconductor light-emitting element is electrically connected to the metallic wiring on the substrate and disposed in a recessed portion; and
the fluorescent substance is filled in the recessed portion.

12. The semiconductor light-emitting device according to claim 1, wherein the base substance is a substrate provided with metallic wiring;
the semiconductor light-emitting element is electrically connected to the metallic wiring on the substrate and disposed in a recessed portion;
a sealing resin is filled in the recessed portion; and
the fluorescent substance is disposed on the sealing resin.

13. The semiconductor light-emitting device according to claim 2, wherein the base substance is a substrate provided with metallic wiring;
the semiconductor light-emitting element is electrically connected to the metallic wiring on the substrate and disposed in a recessed portion;
a sealing resin is filled in the recessed portion; and
the fluorescent substance is disposed on the sealing resin.

14. The semiconductor light-emitting device according to claim 3, wherein the base substance is a substrate provided with metallic wiring;
the semiconductor light-emitting element is electrically connected to the metallic wiring on the substrate and disposed in a recessed portion;
a sealing resin is filled in the recessed portion; and
the fluorescent substance is disposed on the sealing resin.

15. The semiconductor light-emitting device according to claim 4, wherein the base substance is a substrate provided with metallic wiring;
the semiconductor light-emitting element is electrically connected to the metallic wiring on the substrate and disposed in a recessed portion;
a sealing resin is filled in the recessed portion; and
the fluorescent substance is disposed on the sealing resin.

16. The semiconductor light-emitting device according to claim 5, wherein the base substance is a substrate provided with metallic wiring;
the semiconductor light-emitting element is electrically connected to the metallic wiring on the substrate and disposed in a recessed portion;
a sealing resin is filled in the recessed portion; and
the fluorescent substance is disposed on the sealing resin.

17. A semiconductor light-emitting device constituted by mounting a semiconductor light-emitting element on a base substance, wherein the semiconductor light-emitting element emits light having an emission wavelength only in a range of 390 to 420 nm, the light having visibility lower than light in a visible range more than 420 nm;

a first fluorescent substance, a second fluorescent substance and a third fluorescent substance are included;

the first fluorescent substance has red outgoing light having emission wavelengths with its main emission peak in a wavelength range of 600 to 670 nm;

the second fluorescent substance has green outgoing light having emission wavelengths with its main emission peak in a wavelength range of 500 to 540 nm;

the third fluorescent substance has blue outgoing light having emission wavelengths with its main emission peak in a wavelength range of 410 to 480 nm; and the sum of colors of light emitted from the first, second and third fluorescent substances is a white color, wherein the first fluorescent substance is composed of any one or more selected from a fluorescent substance group consisting of:

$M_2O_2S$: Eu (M is any one or more elements selected from La, Gd and Y);
$0.5MgF_2.3.5MgO.GeO_2$: Mn;
$Y_2O_3$: Eu,
Y(P, V) $O_4$: Eu; and
$YVO_4$: Eu;

the second fluorescent substance is composed of any one or more selected from a fluorescent substance group consisting of:

$RMg_2Al_{16}O_{27}$: Eu, Mn (R is any one or both elements selected from Sr and Ba);
$RMgAl_{10}O_{17}$: Eu, Mn (R is any one or both elements selected from Sr and Ba);
ZnS: Cu;
$SrAl_2O_4$: Eu;
$SrAl_2O_4$: Eu, Dy;
ZnO: Zn;
$Zn_2GeO_4$: Mn;
$Zn_2SiO_4$: Mn; and
$Q_3MgSi_2O_8$: Eu, Mn (Q is any one or more elements selected from Sr, Ba and Ca); and
the third fluorescent substance is composed of any one or more selected from a fluorescent substance group consisting of:
$A_{10}(PO_4)_6Cl_2$: Eu (A is any one or more elements selected from Sr, Ca, Ba, Mg and Ce);
$XMg_2Al_{16}O_{27}$: E (X is any one or both elements selected from Sr and Ba);
$XMgAl_{10}O_{17}$: Eu (X is any one or both elements selected from Sr and Ba);
ZnS: Ag;
$Sr_{10}(PO_4)_6Cl_2$: Eu;
$Ca_{10}(PO_4)_6F_2$: Sb;
$Z_3MgSi_2O_8$: Eu (Z is any one or more elements selected from Sr, Ca and Ba);
$SrMgSi_2O_8$: Eu;
$Sr_2P_2O_7$: Eu;
$CaAl_2O_4$: Eu, Nd.

18. The semiconductor light-emitting device according to claim 17, wherein, assuming the total amount as $_{100}$ weight %,
the first fluorescent substance is between 50 weight % and 70 weight % inclusive;
the second fluorescent substance is between 7 weight % and 20 weight % inclusive; and
the third fluorescent substance is between 20 weight % and 30 weight % inclusive.

19. The semiconductor light-emitting device according to claim 18, wherein
the sealing resin contains the first, second and third fluorescent substances; and
the proportion of the total weight of the first, second and third fluorescent substances to the weight of the sealing resin is between 0.5 and 1 inclusive.

20. A light-emitting display device comprising;
a light source using the semiconductor light-emitting device according to claim 17;
a light guiding plate for guiding light from the light source; and
red, green and blue color filters for transmitting light from the light guiding plate and dividing the light; the light-emitting display device, wherein
outgoing light from the semiconductor light-emitting device has a wavelength distribution that matches spectral characteristics of the color filters.

21. The light-emitting display device according to claim 20, wherein at least one of the following is adjusted so that the wavelength distribution of the outgoing light from the semiconductor light-emitting device matches spectral characteristics of the color filters:
the emission wavelength of the semiconductor light-emitting element;
the emission wavelength of the first fluorescent substance;
the emission wavelength of the second fluorescent substance;
the emission wavelength of the third fluorescent substance;
the mixture proportions of the first, second and third fluorescent substances; and the proportion of the total weight of the first, second and third fluorescent substances to the weight of the sealing resin.

* * * * *